(12) United States Patent
Tanaka

(10) Patent No.: US 6,703,891 B2
(45) Date of Patent: Mar. 9, 2004

(54) CHARGE PUMP WITH IMPROVED RELIABILITY

(75) Inventor: Hitoshi Tanaka, Ome (JP)

(73) Assignees: Hitachi, Ltd., Tokyo (JP); Hitachi ULSI Systems Co., Ltd., Tokyo (JP)

(*) Notice: Subject to any disclaimer, the term of this patent is extended or adjusted under 35 U.S.C. 154(b) by 11 days.

(21) Appl. No.: 10/179,222

(22) Filed: Jun. 26, 2002

(65) Prior Publication Data

US 2002/0175746 A1 Nov. 28, 2002

Related U.S. Application Data

(63) Continuation of application No. 09/565,116, filed on May 4, 2000, now Pat. No. 6,456,152.

(30) Foreign Application Priority Data

May 17, 1999 (JP) ............................................. 11-135557

(51) Int. Cl.[7] ................................................. G05F 3/02
(52) U.S. Cl. ....................................... 327/536; 327/537
(58) Field of Search .............................. 327/534, 536, 327/537; 363/59

(56) References Cited

U.S. PATENT DOCUMENTS

| | | | |
|---|---|---|---|
| 4,670,668 A | 6/1987 | Liu | |
| 4,716,313 A | 12/1987 | Hori et al. | |
| 5,072,134 A | 12/1991 | Min | |
| 5,343,088 A * | 8/1994 | Jeon | ............................. 327/536 |
| 5,357,416 A | 10/1994 | Kitano et al. | |
| 5,397,931 A | 3/1995 | Bayer | |
| 5,444,362 A * | 8/1995 | Chung et al. | |
| 5,633,825 A * | 5/1997 | Sakuta et al. | ................ 327/534 |
| 6,046,626 A * | 4/2000 | Saeki et al. | .................. 327/536 |
| 6,225,854 B1 * | 5/2001 | Cha | ............................. 327/536 |
| 6,366,482 B1 * | 4/2002 | Jeong | ........................... 327/535 |

* cited by examiner

*Primary Examiner*—Terry D. Cunningham
(74) *Attorney, Agent, or Firm*—Antonelli, Terry, Stout & Kraus, LLP

(57) ABSTRACT

A semiconductor integrated circuit device having an internal voltage generating circuit which generates a voltage two or more times higher than an operating voltage while at the same time reducing the voltage applied to a device, thereby ensuring the device reliability. In a charge pump circuit driven by supply voltage VDD, a maximum of 2VDD or a similar level voltage is applied between the drain and source of a MOSFET, the MOSFET being connected in series with a conduction MOSFET of the same type, the gate of which is supplied with VD−VDD, or a potential which is VDD lower than VD, the drain potential before its connection. The gate potential is obtained directly from a node in said charge pump which generates a voltage pulse synchronized with the voltage between the drain and source of that MOSFET, or through another rectifier device branched via a capacitor from the node.

18 Claims, 12 Drawing Sheets

US 6,703,891 B2

CHARGE PUMP WITH IMPROVED RELIABILITY

This application is a continuation of U.S. application Ser. No. 09/565,116, filed May 4, 2000, now U.S. Pat. No. 6,456,152 the entire disclosure of which is incorporated herein by reference.

FIELD OF THE INVENTION

This invention relates to semiconductor integrated circuit devices including dynamic random access memories having voltage boosting circuits built in.

BACKGROUND OF THE INVENTION

An example of a dynamic RAM that incorporates pumping circuitry to generate a substrate voltage and a boosted voltage is disclosed in Japanese Patent Application Provisional Publication No. 214669/91. In this application, the pumping circuitry (charge pump circuit) which generates a substrate voltage and a boosted voltage consists of a main circuit and a sub-circuit, where the sub-circuit has only a small current capability to compensate for leakage current and the like.

In recent years, more and more semiconductor integrated circuits, such as memories and microprocessors, incorporate positive or negative charge pump circuits in their chips in order to provide a user-friendly single external power supply or enhance the performance of the devices. However, in address selective MOSFETs which constitute memory cells in dynamic RAMS, it is difficult to decrease the threshold voltage, because a decrease in threshold voltage means an increase in sub-threshold current in accordance with the rule of scaling, which reduces the information retention time. The voltage to be generated in the charge pump circuit, or the selection level in said address selective MOSFETs, cannot be lowered in proportion to the device size even if the device is very small, but will be nearly the same level as the device withstand voltage. Thus, it is an important objective to ensure the reliability of these devices.

FIG. 10 shows a voltage boosting circuit conceived prior to this invention. In this circuit, after capacitors CB1, CB2 and CB4 are precharged to the level of VDD, nodes N1 and N2 are brought to VDD. Here, the charge in capacitor CB2 passes through MOSFET M8 to bring the drain and source sides of capacitor CB4 to 2VDD. Therefore, the potential on the gate side of capacitor CB4 becomes 3VDD. Since in this circuit the gate voltage of the rectifier MOSFET M1 goes up to 3VDD, the current capability can be increased. If a device made through the 0.3 μm process is used, VCH is 4.0 V with VDD=2.9 V, VTN(M1)=1 V, W/L(M1)=75 μm/1 μm, load current=2 mA, which satisfies the voltage requirement of 3.8 V for fully writing into the memory cells. However, a maximum of 2VDD is applied to MOSFET M7, which voltage exceeds the device gate withstand voltage. Usually, the permissible electric field for a gate oxide film is below 5 MV/cm. In this circuit, however, if tox=8 nm, the gate-source voltage of the MOSFET M7 becomes 7.2 V and the electric field becomes 9 MV/cm at VDD=3.7 V, which exceeds the permissible voltage range.

The object of this invention is to provide a semiconductor integrated circuit device which has an internal voltage generating circuit to reduce the voltage applied to devices while generating a voltage which is two or more times higher than the operating voltage and ensure the device reliability. This object and other objects of the invention and its novel features will be more clearly understood from the following specification and the attached drawings.

SUMMARY OF THE INVENTION

Typical embodiments of this invention are briefly summarized below. In the charge pump circuit which is driven by the supply voltage VDD, a MOSFET, having a maximum of 2VDD or a similar level voltage applied between the drain and source thereof, is connected in series with an equivalent conduction type MOSFET, which has its gate supplied with VD−VDD, or a potential VDD lower than VD (drain potential before the connection). The above-said gate potential is obtained directly from a node in the above charge pump circuit generating voltage pulses synchronized with the voltage between the drain and source of that MOSFET or through another rectifier device branched via a capacitor from the node.

DETAILED DESCRIPTION OF THE PREFERRED EMBODIMENTS

Figure 11:
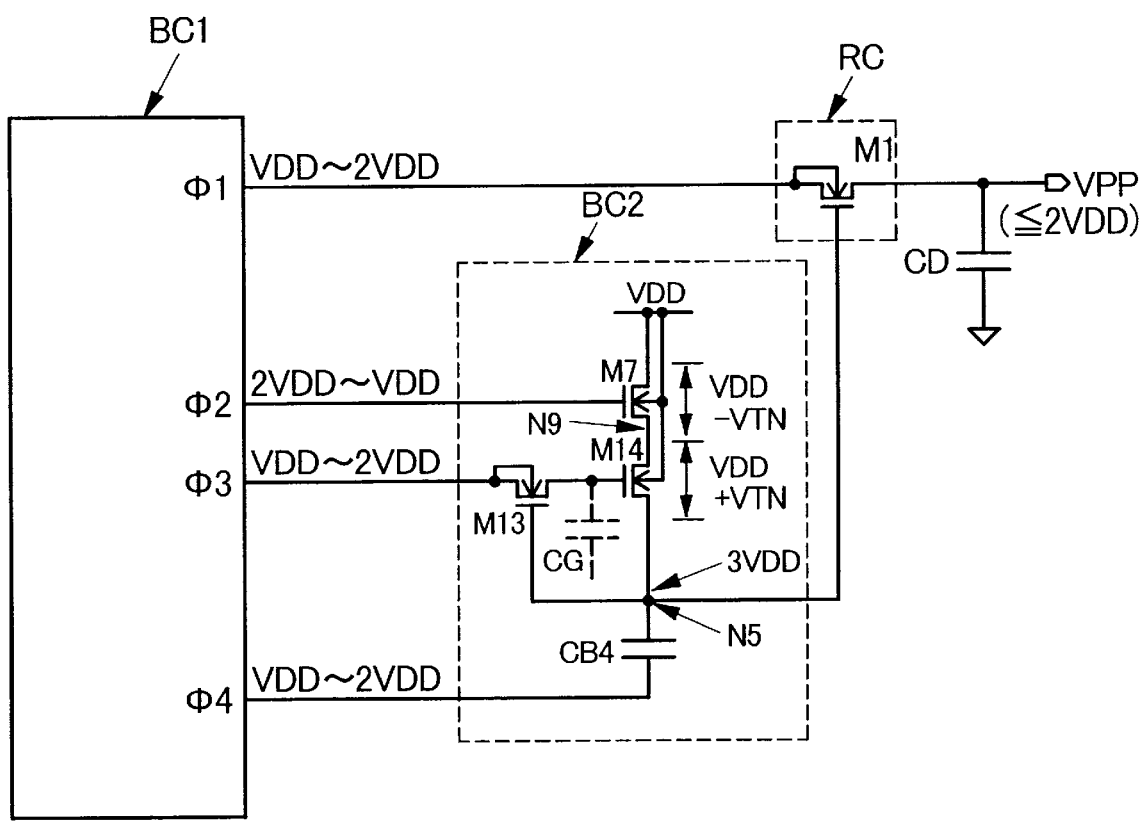
FIG. 11 is a schematic diagram showing the voltage boosting circuit according to this invention.

FIG. 11 shows the voltage boosting circuit according to this invention. In accordance with this invention, an output of 3VDD from the second voltage boosting circuit is supplied to the gate of MOSFET M1 incorporated in the rectification circuit RC, for efficient output of boosted voltage VPP.

The second voltage boosting circuit BC2 is provided with a capacitor CB4; a MOSFET M7 which precharges capacitor CB4; a MOSFET M14 for voltage relaxation located between MOSFET M7 and capacitor CB4; and a MOSFET M13 for rectification. The capacitor CB4 is precharged to VDD by MOSFET M7, and boosts node N5 to 3VDD as output Φ4 of the first voltage boosting circuit BC1 changes from VDD to 2VDD. When the node N5 becomes 3VDD, output Φ3 from the first boosting circuit is input to the gate of MOSFET M14 to reduce the voltage between the source and drain of MOSFET M7 to VDD−VTN, instead of 2VDD. In the descriptions made hereafter, special attention will be given to voltage relaxation between the source and drain. However, it should be noted that voltage relaxation also occurs between the source and gate similarly. In addition, as far as one MOSFET is concerned, relaxation of the voltage between two nodes also results in relaxation of the electric field within the MOSFET. Due to this arrangement, the source-drain voltage of MOSFET M7 is always not more than VDD so that even in the case of using a device with a low gate withstand voltage, the resistance to gate breakdown can be improved. Here, Φ1 to Φ4 denote outputs of the voltage doubler circuit which fluctuate between VDD and 2VDD, but they need not always be outputs from different nodes. For instance, Φ3 and Φ4 or Φ1 and Φ2 may be outputs from one node. In the above explanation, theoretically 2VDD is twice as high as VDD and 3VDD is three times as high as VDD. In reality, however, a slight drop in potential will occur according to the charge share of the embodied circuit and 2VDD and 3VDD will be slightly lower than the respective theoretical levels.

Figure 1:
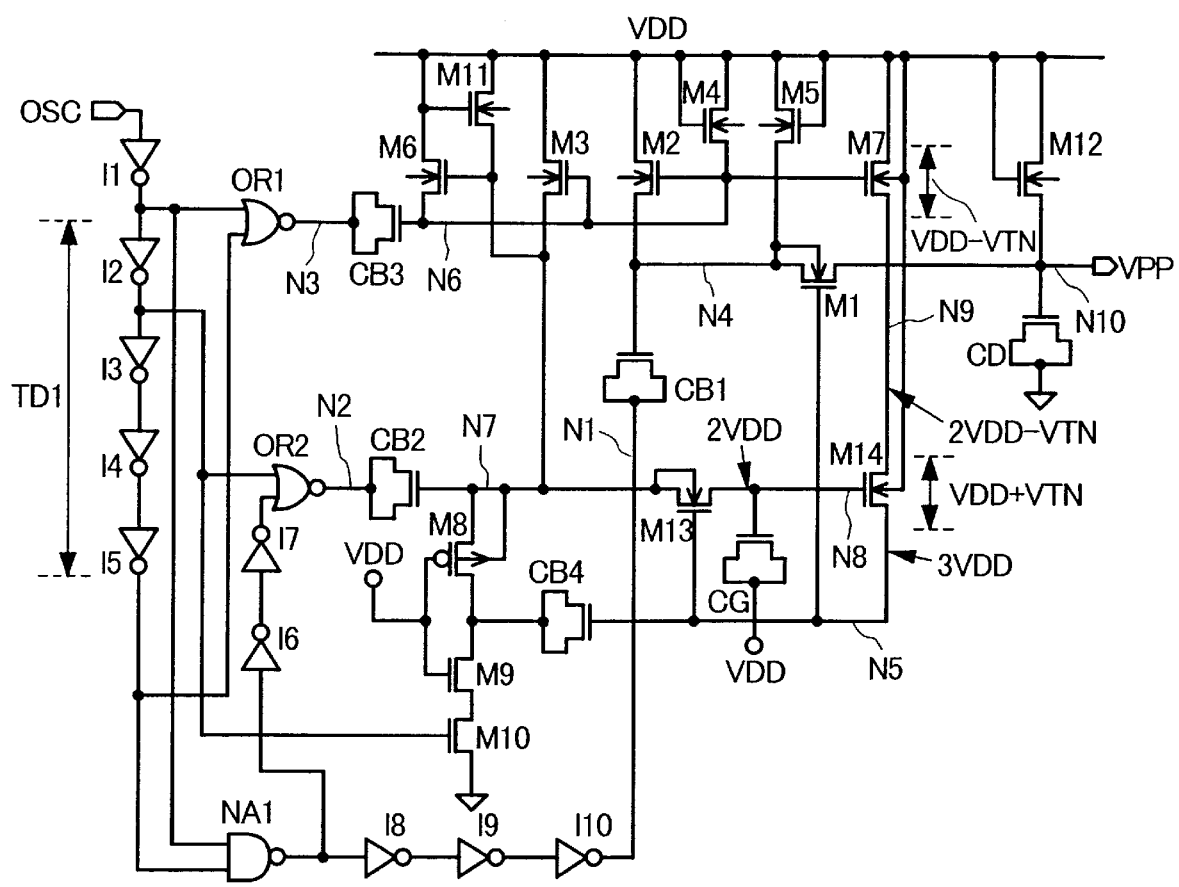
FIG. 1 is a circuit diagram showing an embodiment of the voltage boosting circuit according to this invention.

FIG. 1 is a circuit diagram of an embodiment of the voltage boosting circuit according to this invention. In this figure, p-channel type MOSFETs can be distinguished from n-channel type MOSFETs by marking their gates with a circle (O) to show that the low level is an active level. In addition, MOSFETs such as M1, M7, M8 and M13 in which the substrate gate and source are connected in common are provided in an electrically isolated well region. Therefore, this is a triple-well structure in which N-type well region DWLL is formed deep in the P-type substrate and P-type well region PWELL is formed in the region DWLL to provide said n-channel type MOSFET.

Figure 2:
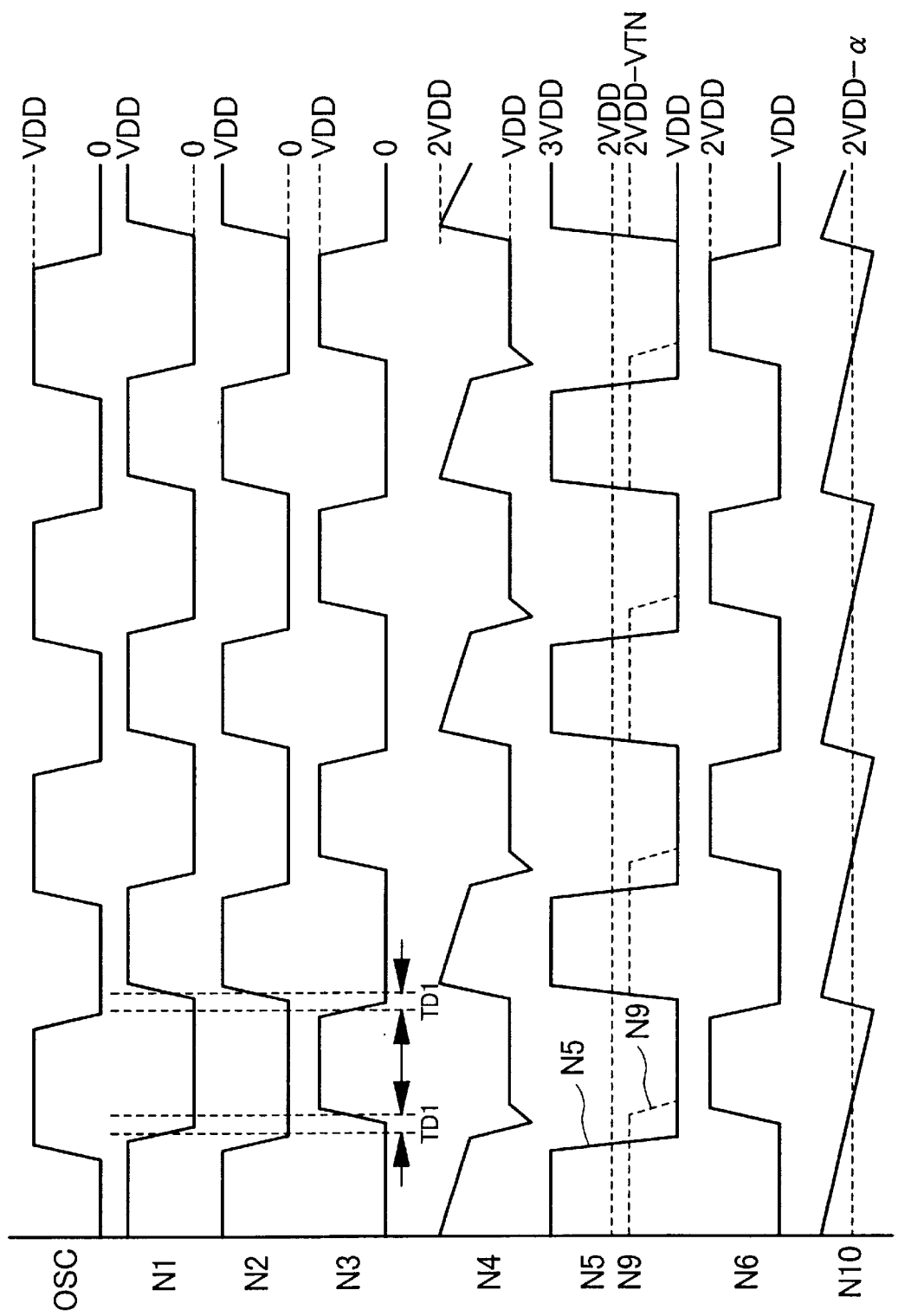
FIG. 2 is a timing diagram of internal voltage waveforms illustrating the operation of the voltage boosting circuit shown in FIG. 1.

The voltage boosting circuit of this embodiment is designed so as to allow efficient generation of said boosted voltage VPP and also to keep the internal voltage below VDD in consideration of the low withstand voltage of miniaturized MOSFETS. In this embodiment, the boosting circuit consists of a combination of four circuits. FIG. 2 shows internal voltage waveforms to illustrate its operation.

NOR gate circuit OR1 constitutes a drive circuit and, in combination with capacitor CB3, constitutes a charge pump circuit. Likewise, the following combinations each constitute charge pump circuits: NOR gate circuit OR2 and capacitor CB2; inverter circuit I10 and capacitor CB1; and p-channel type MOSFET M8 which uses the voltage boosted by said capacitor CB2 as an operating voltage, n-channel type MOSFET M9, n-channel type MOSFET M10 and capacitor CB4. MOSFET M6 constitutes the precharge circuit for said capacitor CB3 while MOSFET M2 constitutes the precharge circuit for capacitor CB1. MOSFET M7 constitutes the precharge circuit for capacitor CB4 and MOSFET M14 is provided for voltage relaxation.

As shown in the timing diagram of FIG. 2, the potential of node N1 varies between 0V−VDD according to pulse OSC; and the potential of node N4 on the output side of capacitor CB4 driven by that potential peaks at 2VDD and then decreases again to 2VDD as mentioned above due to charge transfer (current injection) to the output capacitor CD via the rectifier MOSFET M1. This sequence is repeated. In this embodiment, the drive voltage supplied to the gate of said rectifier MOSFET M1 is brought to as high as 3VDD to improve the charge pump efficiency.

In order to generate said high voltage of 3VDD (boosted voltage of node N7 generated by capacitor CB2), 2VDD is used as the drive voltage for capacitor CB4. The capacitor CB3 generates the drive voltage for MOSFET M3 to precharge said capacitor CB2 to VDD. In other words, the potential of node N6 is varied between VDD−2VDD to drive MOSFETs M3, M2 and M7, then precharges capacitors CB1, CB2 and CB4 to VDD without threshold voltage loss of each MOSFET.

Said MOSFETs M4 and M11 precharge nodes N6 and N7 to VDD−VTH (VTH: threshold voltage of MOSFET) in their initial status when supply of pulse OSC is started. As the potentials of nodes N7 and N6 are increased by the boosting operation, MOSFET M6 and MOSFET M3 precharge capacitors CB2 and CB3, allowing VDD to be reached without threshold voltage loss as described above.

In this embodiment, MOSFET M14 is provided between the drain and source of MOSFET M7 for precharge of the capacitor CB4 for the purpose of relaxation of the voltage 2VDD being applied, at the time when rectifier MOSFET M1 is turned on. This means that, although MOSFET M14 is inserted into the precharge line for said capacitor CB4, its operation relaxes the voltage between the source and drain of said MOSFET M7.

In this embodiment, nonlimitatively, a capacitor CG is provided to hold the boosted voltage 2VDD generated by said capacitor CB2 and the boosted voltage 2VDD thus held is supplied to the gate of MOSFET M14 for voltage relaxation as described above. MOSFET M13 is provided for rectification of this capacitor CG and its gate is supplied with the potential of output node N5 on the boosted side of said capacitor CB4; and during the boosting operation, MOSFET M13 is turned on and the potential of 2VDD at said node N7 is transferred to the capacitor CG.

The pulse OSC brings the potential of node N2 to the low level and when the precharge voltage VDD is applied to node N7, a precharge voltage like VDD is accordingly applied from MOSFETs M7 and M14 to node N5. As a result, MOSFET M13 turns off and 2VDD is held by the capacitor CG as described above and the doubled voltage 2VDD is applied to MOSFET M14 as in the case of MOSFET M7, which allows capacitor CB4 to be precharged to the supply voltage VDD.

In this way, by adding MOSFET M14 as a voltage relaxation device and bringing its gate potential to 2VDD the instant that node N5 is boosted to 3VDD, the maximum voltage in this circuit can be reduced from 2VDD (voltage which would be applied between the drain and source of MOSFET M7 if MOSFET M14 should not be used), to VDD+VNT (voltage which is applied between the drain and source of MOSFET M14). Here, VTN denotes the threshold voltage of MOSFET M14 and its back gate potential is VDD, or below 0.5 V. Thus, by bringing the back gate potential of MOSFET M14 to VDD, the threshold voltage of MOSFET M14 is lowered, thereby decreasing the drain-source voltage. Another advantage is that capacitor CB4 is quickly precharged due to the PN junction diode provided between the back gate and node N5.

This shortens the time from power-on until the desired output level is reached. If the back gate of MOSFET M14 should be connected to VSS, nodes N5 and N8 would be almost 0 V just after power-on, so it would take a very long rise time. Here, capacitor CG is a capacitor to stabilize the potential of node N8. This maintains the potential of node N8 almost at 2VDD despite a boosting time lag if any between nodes N8 and N5, preventing an excessive voltage from being applied between the drain and source of MOSFET M14. Since the duration of the lag is usually short, the capacitor CG will not be needed if the device withstand voltage is ample.

Figure 12:
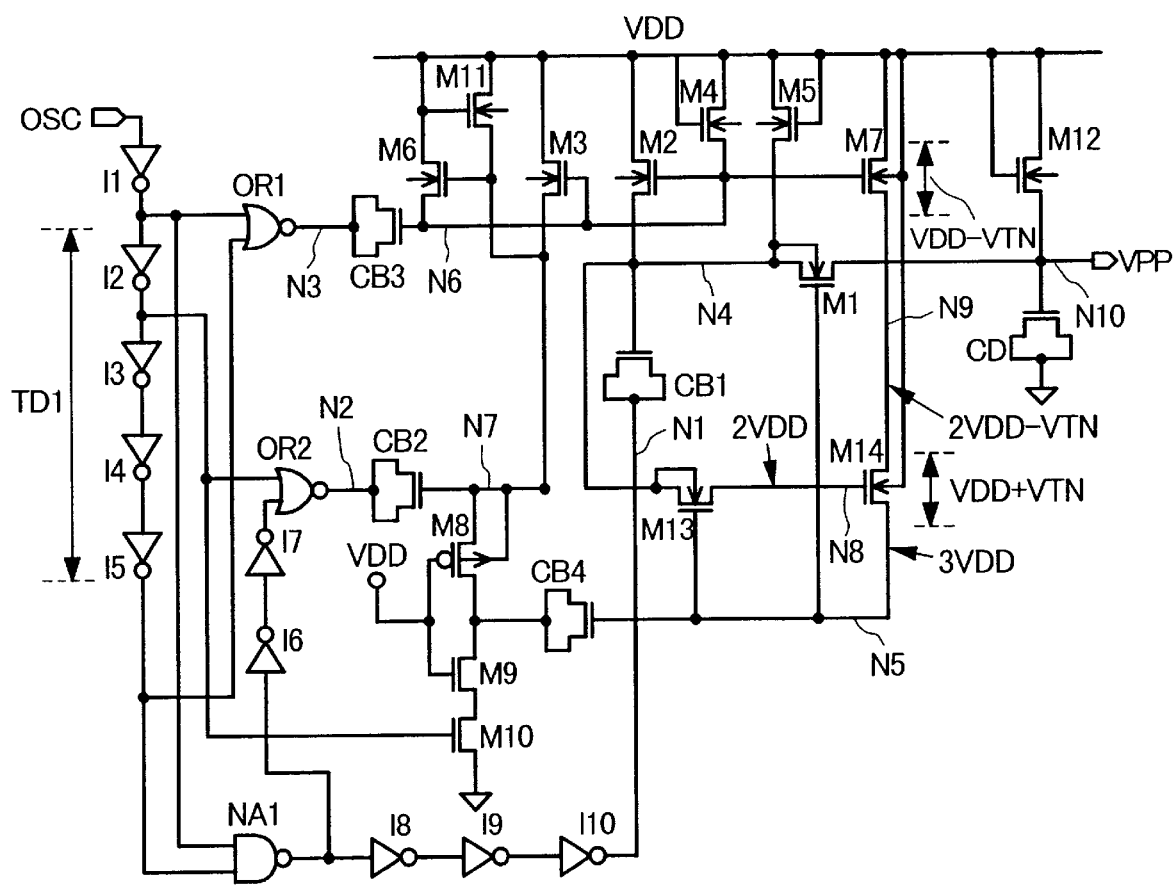
FIG. 12 is another circuit diagram showing an embodiment of the voltage boosting circuit according to this invention.

FIG. 12 shows another embodiment of the voltage doubler circuit according to this invention. This embodiment is different from that shown in FIG. 1 in that the drain of MOSFET M13 for voltage relaxation is connected to node N4 of capacitor CB1 instead of node N7 as shown in FIG. 1. As understood from FIG. 1 and FIG. 2, in the voltage doubler circuit shown in this embodiment, the potential of node N5 is designed to drop earlier than that of node N4 in order to prevent the charge from moving back from node N10 to node N4 through M1. Therefore, according to this embodiment, the potential of node N5 drops to the level of VDD and M13 is cut off thoroughly before the potential of node N4 goes down, which completely prevents the charge of node N8 from moving back. Therefore, one advantage is that the potential holding capacitor CG can be omitted.

Figure 3:
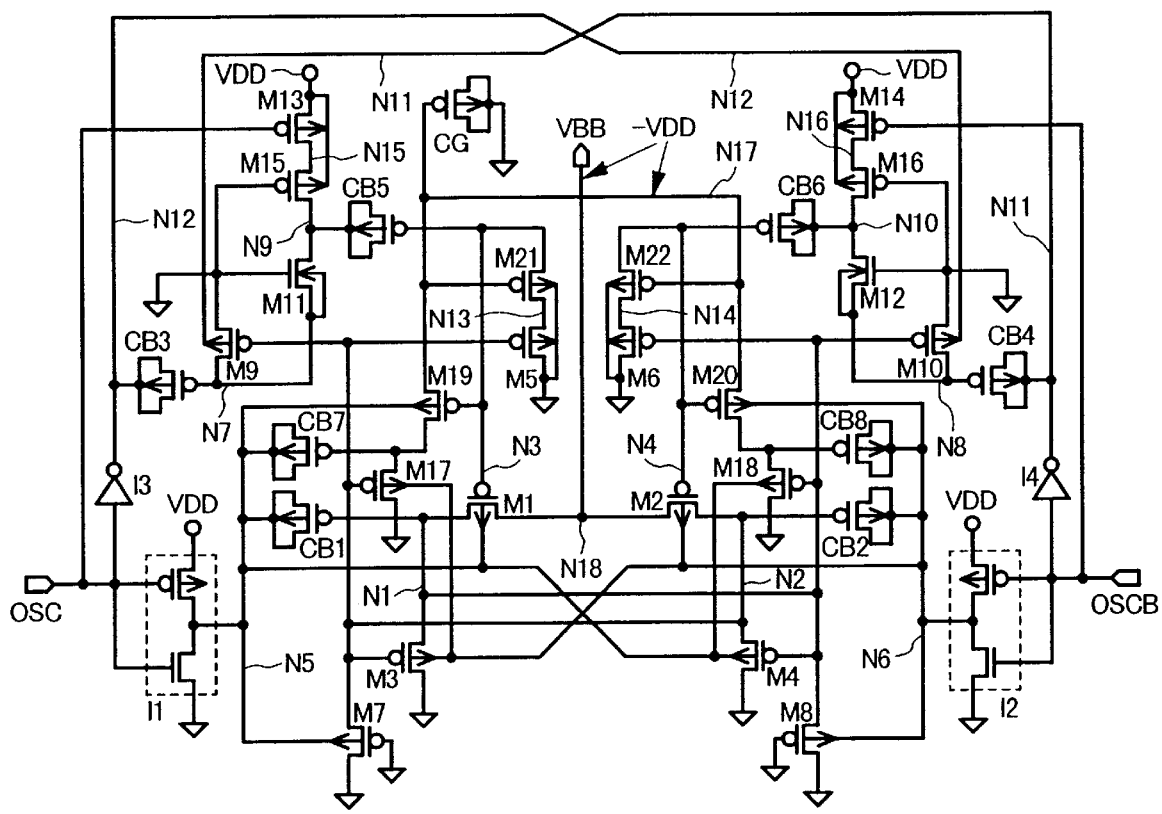
FIG. 3 is a circuit diagram showing an embodiment of the negative voltage generating circuit according to this invention.

FIG. 3 shows a circuit diagram of one embodiment of the negative voltage generating circuit according to this invention. Though some of the circuit codes used for devices in this figure are identical to those used in FIG. 1 for better understanding of the subject matter, it should be noted that they have different circuit functions. This also can be said of the other drawings to be explained later.

In this embodiment, nonlimitatively, the major MOSFETs are p-channel devices. These p-channel type MOSFETs are provided in the N-type well region. Therefore, they can be electrically isolated from the P-type well region where memory cells are formed and a few carriers are generated in the N-type well region during the charge pumping operation. Thus, if these MOSFETs are used in the negative voltage generating circuit of a dynamic RAM, they will have no impact on the memory cells formed in such P-type well region.

The basic pumping circuit which generates a negative voltage VBB employs a drive circuit consisting of a capacitor CB1 (MOS capacitor) and a CMOS inverter circuit I1 which uses a p-channel type MOSFET and a n-channel type MOSFET. Capacitor CB2 and CMOS inverter circuit I2 also constitute the same basic circuit as the above one except that input pulses OSC and OSCB are complementary with each other as the timing of becoming active is different between them so that they alternately work synchronously with the input pulses, permitting efficient charge pumping.

As a rule, rectifier MOSFETs M1 and M2 can be of the diode type, but if so, a loss equivalent to the threshold voltage will occur. If the "high" level of pulse signal OSC is as low as around 3.3 V, virtually no operation would occur. So, considering that MOSFET M2 should be on when input pulse OSC is at the "high" level, the negative voltage –2VDD is generated at node N3 with respect to the "low" level (0 V) of the output signal of said inverter circuit I3 to turn on said MOSFET M1 by providing inverter circuit I3, which generates pulses similar to input pulses, to drive capacitor CB3, and arranging it so that when said input pulse OSC is at the "low" level, capacitors CB3 and CB5 are each precharged to VDD and when said input pulse OSC is at the "high" level, the capacitors are connected in series.

In this structure, with MOSFET M1 on, it is possible to make the gate voltage lower than the source-drain voltage of M1 by VDD, so the negative voltage generated by said capacitor CB1 can be output without any threshold voltage loss. As a result, the output voltage VBB can be lowered to –VDD.

Said n-channel type MOSFET M11 functions as a switch to connect said two capacitors CB3 and CB5 in series and, at the same time, constitutes a circuit to precharge capacitor CB3 to VDD in combination with p-channel type MOSFETs M13 and M15. Said MOSFETs M13 and M15, and MOSFETs M5 and M21 constitute a circuit to precharge capacitor CB5 to VDD. Among said MOSFETs M13 and M15, and M5 and M21, MOSFETs M13 and M5 are originally designed to constitute precharge circuits, respectively, and MOSFETs M15 and M21 connected to these are provided for the purpose of voltage relaxation as described above.

When a negative voltage is generated, a supply voltage like VDD is supplied to one end of MOSFET M13 and the negative voltage (–VDD) generated by capacitor CB2 is supplied to the other end, which results in a high voltage difference of 2VDD or so as in the boosting circuit mentioned earlier. For the purpose of relaxation of such a high voltage, MOSFET M15 is connected in series and a grounding potential of 0 V is applied to its gate so that VDD is almost equally applied to the source-drain of each MOSFET. Similarly, when said negative voltage is generated, a large voltage of –2VDD is generated by capacitor CB5 and is applied to both ends of MOSFET M5 in the precharge circuit. For the purpose of relaxation of such high voltage, MOSFET M21 is connected in series with said MOSFET M5 and –VDD is applied to its gate. This almost equally applies VDD to the source-drain of each MOSFET.

Capacitor CB7 and MOSFETs M17 and M19 constitute a charge pump circuit to generate –VDD to be applied to the gate of said MOSFET M21 for voltage relaxation and nonlimitatively such negative voltage –VDD is held by capacitor CG to bias MOSFET M21 to maintain its gate voltage at –VDD.

MOSFET M3 is turned off at an early stage by receiving the "high" level output signal from the drive inverter circuit I2 where the back gate (channel) receives the other input pulse OSCB, so that the substrate potential can be dropped efficiently. Similarly, by supplying the output signal from the drive inverter circuit I1 to the back gate of MOSFET M1, MOSFET M1 is turned off at an early stage when capacitor CB1 is charged up, so that leakage of negative voltage VBB is minimized.

For the control voltage supplied to the gate of MOSFET M2 according to the other input pulse OSCB and the back gate voltages of MOSFETs M4 and M1, the pulse signal generated by a similar inverter circuit I2 and capacitors CB4 and CB6 and the pulse signal generated according to the input pulse OSC are used. In this case, MOSFET M14, to which a high voltage with a voltage difference of 2VDD (between +v and –V) is applied, as mentioned above, is connected in series with MOSFET M16 for voltage relaxation, and MOSFET M6, where –2VDD is applied at both ends, is connected in series with MOSFET M22 for voltage relaxation.

Figure 4:
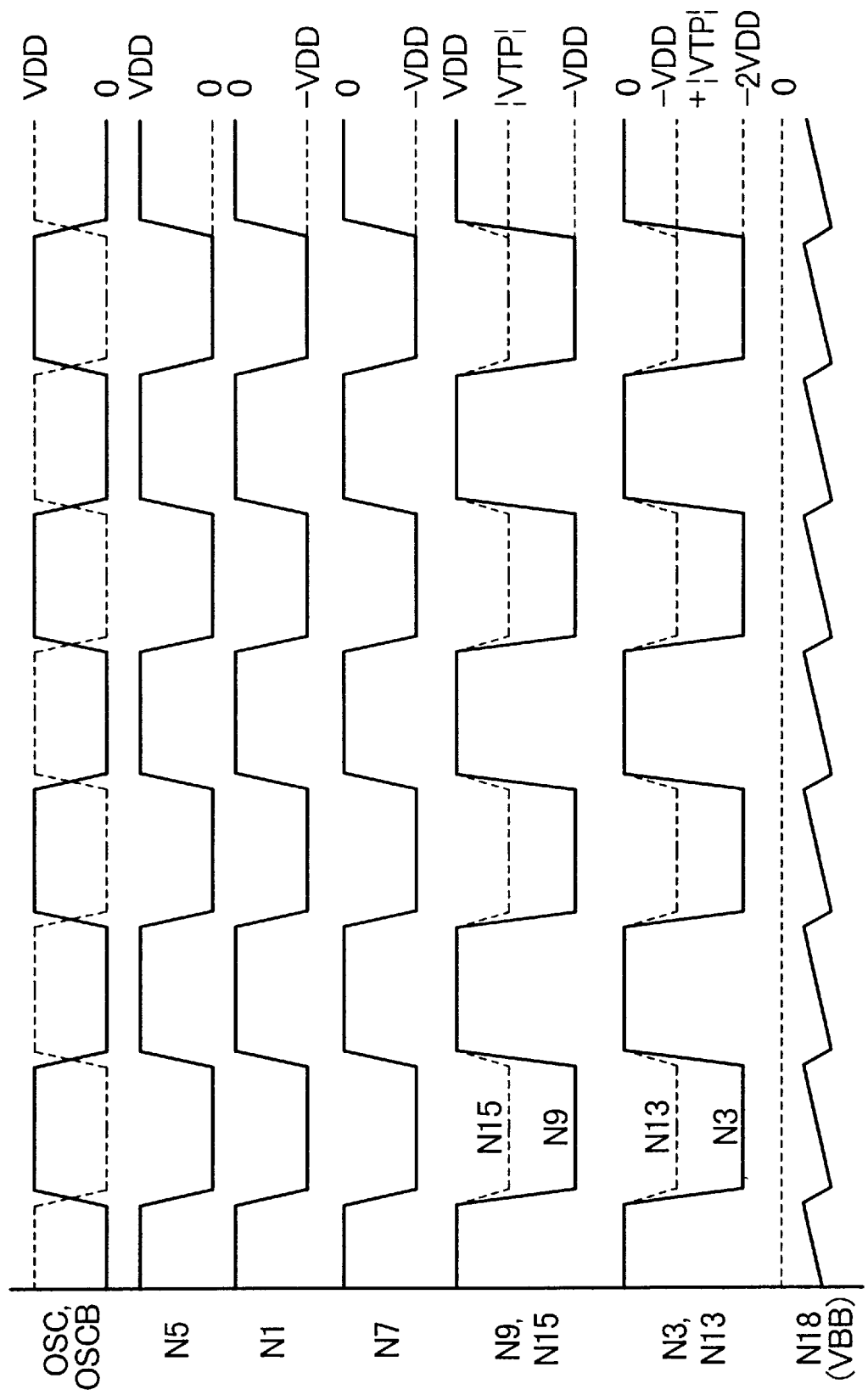
FIG. 4 is a waveform diagram of internal voltage waveforms illustrating the operation of the negative voltage generating circuit shown in FIG. 3.

FIG. 4 shows waveforms of the negative voltage generating circuit as shown in FIG. 3. This circuit is characterized in that MOSFETs M5, M6, M13, and M14 are connected in series with MOSFETs for voltage relaxation, M21, M22, M15, and M16, respectively, and that the gate voltages of MOSFETs M21 and M22 are set at –VDD synchronously with boosting of node N3 or N4 to –2VDD while the gate voltage of MOSFETs M15 and M16 is always set at VSS (0 V).

As illustrated in the waveform diagram of FIG. 4, the maximum voltage applied to this circuit is as low as VDD+ |VTP| (voltage applied between the drain and source of MOSFETs M21, M22, M15 and M16), in comparison to 2VDD which would be applied between the drain and source of MOSFETs M5, M6, M13 and M14, if MOSFETs M21, M22, M15 and M16 were not used. Here, |VTP| denotes the absolute value of the threshold voltage of MOSFETs M21, M22, M15 and M16. Capacitor CG reduces the fluctuation of node N17 and prevents an excessive voltage from being applied to MOSFETs M21 and M22 as in the embodiment of FIG. 1. This capacitor can be omitted if the withstand voltage of MOSFETs M21 and M22 is ample.

Figure 5:
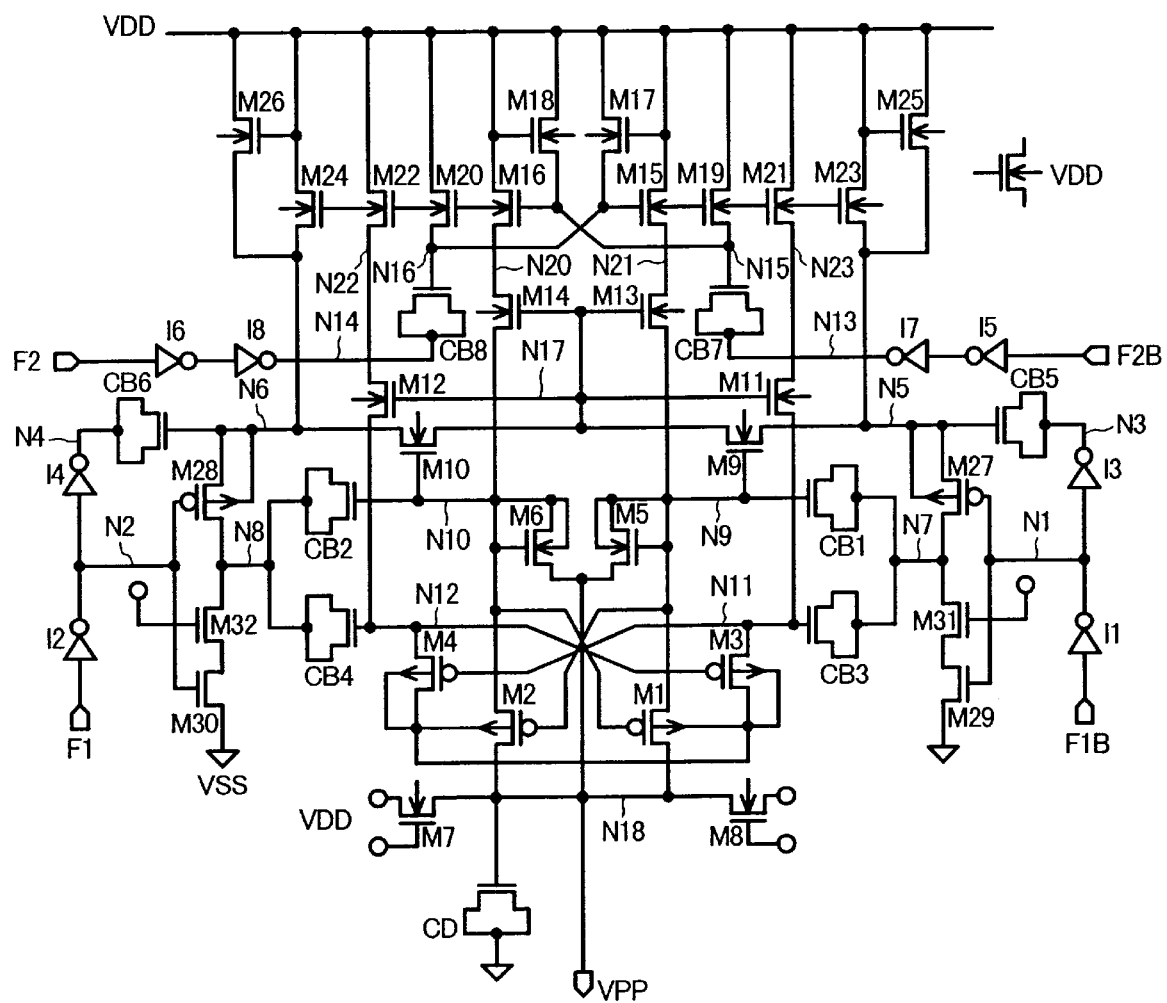
FIG. 5 is a circuit diagram showing an embodiment of the voltage tripler circuit according to this invention.
Figure 6:
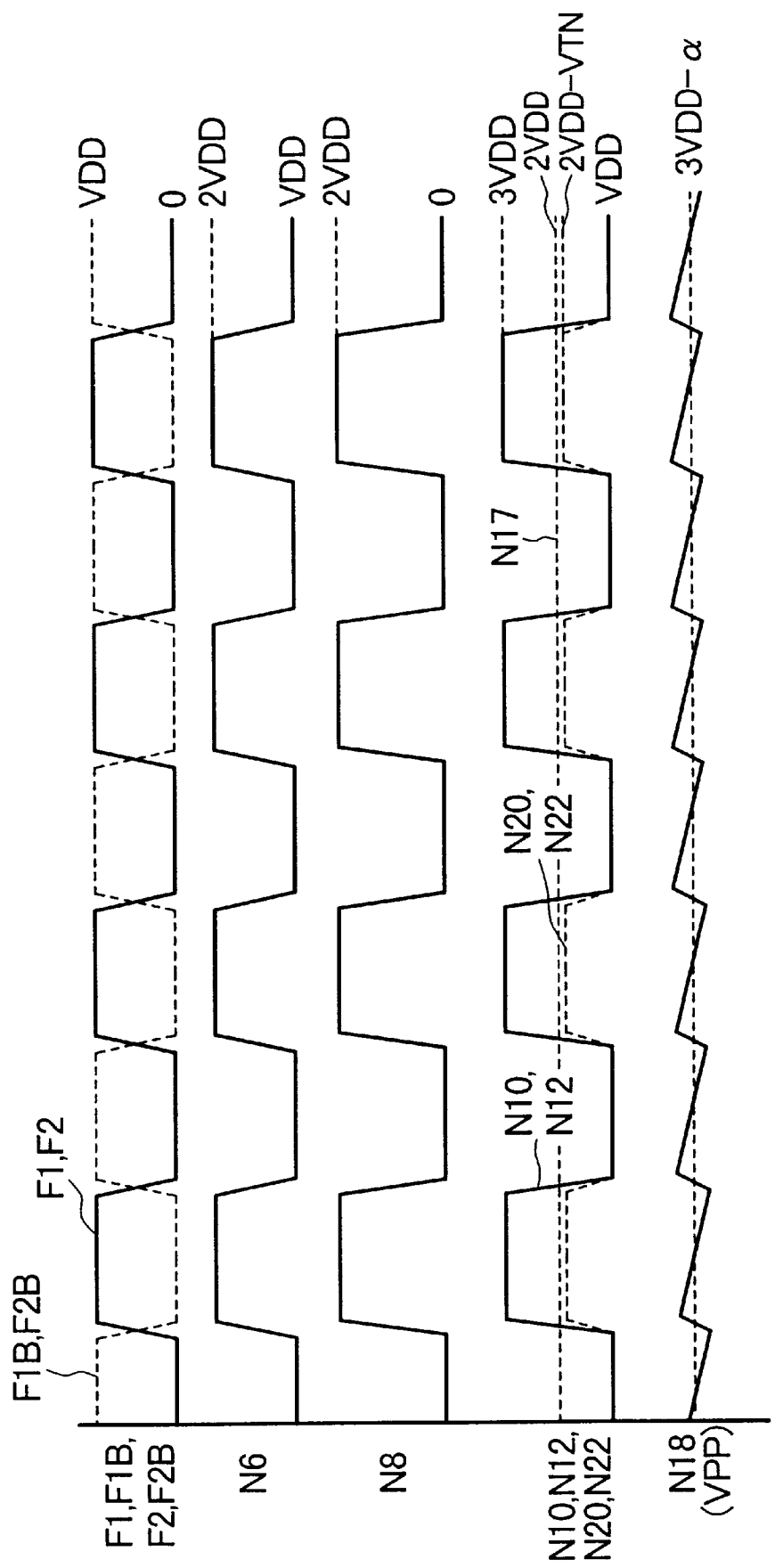
FIG. 6 is a diagram of internal voltage waveforms illustrating the operation of the voltage tripler circuit shown in FIG. 5.

FIG. 5 shows a circuit diagram of an embodiment of the voltage tripler circuit according to this invention. FIG. 6 shows internal voltage waveforms to illustrate its operation. In this embodiment, CMOS inverter circuit I3 and capacitor CB5 which constitute a drive circuit, doubles the voltage to 2VDD, the drive circuit (M27, M29, M31) activated by this voltage and capacitor CB1 triple the voltage, and p-channel type rectifier MOSFET M2 is used for output capacitor CD to hold 3VDD. CMOS inverter circuit I4 and capacitor CB6, which constitute a similar drive circuit, doubles the voltage to 2VDD, the drive circuit (M28, M30, M32) activated by this voltage and capacitor CB2 triple the voltage, and p-channel type rectifier MOSFET M2 is used for said output capacitor CD to hold 3VDD.

Pulses F1B and F1 which are input to the above two sets of circuits are complementary with each other as they become active at different times so that they alternately activate the above-said two sets of circuits, permitting efficient charge pumping as illustrated in the waveform chart.

This circuit is characterized in that MOSFETs for voltage relaxation, M13, M14, M11, and M12 are provided for MOSFETs M15, M16, M21, and M22, respectively, and that the gate voltages of MOSFETs M13, M14, M11 and M12 are set at 2VDD synchronously with the timing of boosting nodes N9 and N11 or N10 and N2 to 2VDD. With this, the maximum voltage applied to this circuit is as low as VDD+ VTN (voltage applied between the drain and source of MOSFETs M11–M13), in comparison to 2VDD which would be applied between the drain and source of MOSFETs M15, M16, M21 and M22 if MOSFETs M11–M13 were not used. Here, VTN denotes the threshold voltage of MOSFETs M11–M13.

It is needless to say that if a capacitor is inserted between node N17 and VDD or VSS as mentioned earlier, the fluctuation of the node is reduced and the reliability of MOSFETs M11–M13 is improved. As shown in the same figure, the back gates of MOSFETs M11–M16, M21 and M22 should be connected to VDD in order to quicken the rise of nodes N9, N10, N11 and N12 upon turning on the power.

Thus, the gate potential of a MOSFET for voltage relaxation should be obtained directly from a node in the above charge pump circuit generating voltage pulses synchronized with the voltage between the drain and source of the MOSFET for voltage relaxation, or through another rectifier device branched via a capacitor from the node. This enables the gate potential generating circuit and charge pump circuit drive circuit concerned to be shared, which reduces the occupied area on the chip. In addition, because boosting of the gate potential concerned is synchronized with that of the drain potential concerned, there is no need to attach a smoothing capacitor to stabilize the gate potential, which also reduces the occupied area on the chip.

Figure 7:
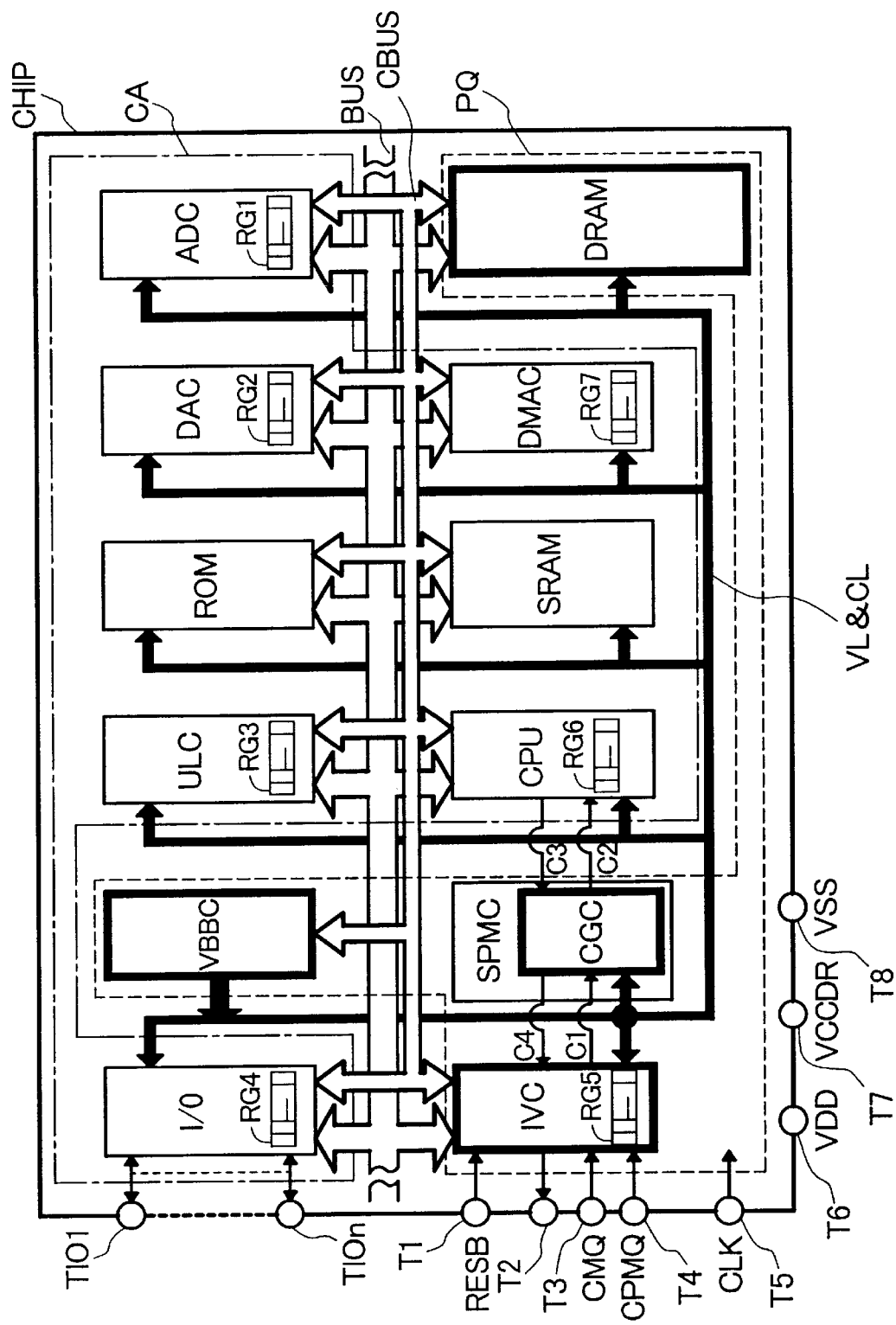
FIG. 7 is an overall block diagram showing an embodiment of a system LSI to which this invention is applied.

FIG. 7 is an overall block diagram of an embodiment of a system LSI to which this invention is applied. The semiconductor integrated circuit device CHIP of this embodiment comprises the following circuit blocks as indicated: an input-output circuit (I/O), a substrate bias control circuit (VBBC), a control circuit (ULC), a read only memory (ROM), a D/A converter (DAC), an A/D converter (ADC), an interruption control circuit (IVC), a system power management circuit (SPMC) with a clock generating circuit (CGC), a central processing unit (CPU) and a static memory (SRAM), a DMA controller (DMAC) and a dynamic memory (DRAM).

These circuit blocks are connected to an internal bus (BUS) and a control bus (CBUS). They are mounted on a semiconductor substrate (not indicated) which makes up a semiconductor integrated circuit device. Said system power management circuit (SPMC) has a function to control power consumption in modules mounted on the system LSI.

The semiconductor integrated circuit device has the following terminals: TIO1 or TION (an external input-output terminal connected to the input-output circuit I/O), T1 (an external terminal to which reset signal RESB such as a negative logic level is sent), T2 (an external terminal for control), T3 (an external terminal for first operation control to which first operation control signal CMQ is sent), T4 (an external terminal for second operation control to which second operation control signal CPMQ is sent), T5 (an external clock terminal to which the external clock signal CLK is sent), and T6, T7 and T8 (external terminals to which supply voltages VDD, VCCDR and VSS are sent).

Nonlimitatively, supply voltage VDD is designed as the supply voltage to activate the internal circuit blocks and is set at 1.8 V±0.15 V; and supply voltage VCCDR, which is set mainly for the input-output circuit (I/O) according to the input/output level required for the semiconductor integrated circuit device, is set to 3.3 V±0.3 V, 2.5 V±0.25 v or 1.8 V±0.15 V. Supply voltage VSS is a reference potential for the circuitry called grounding potential.

The semiconductor integrated circuit device as indicated should be an application-specific integrated circuit (ASIC). This means that most of the circuit blocks as indicated should constitute so-called modules or macro-cells operating as independent functional units to facilitate the configuration as an ASIC. Each functional unit should be scalable and configurable. For an ASIC, among the indicated circuit blocks, ones which are not required by the electronic system to be implemented can be excluded from the substrate. Inversely, it is also possible to add non-indicated circuit blocks as functional units.

Nonlimitatively, the semiconductor integrated circuit device should have the CMOS structure which enables its operating characteristics to be fully demonstrated even under low supply voltage VDD such as 1.8 V±0.15 V.

The dynamic memory mounted on the semiconductor integrated circuit device can be activated by said supply voltage VDD. In the semiconductor integrated circuit device of this embodiment, however, the high supply voltage which is generated by the voltage generating circuit activated by said supply voltage VDD is also used for the dynamic memory in addition to said supply voltage. In the dynamic memory, the row decoder which selects dynamic memory cells is activated by such high supply voltage, while the circuit which receives signals from, or sends signals to, the internal bus (BUS) of the semiconductor integrated circuit device is activated by low supply voltage like VDD. This configuration increases the amount of electric charge as information given to dynamic memory cells, which results in improvement of the information holding time characteristic of the dynamic memory. Also, high speed reading can be performed by having the sense amplifier activated by the overdrive method using said boosted voltage VBS.

(Central Processing Unit CPU)

Nonlimitatively, the central processing unit has the same structure as a so-called microprocessor. The CPU, details of which are not indicated in the figure, incorporates the following input-output circuits: a command register; a micro command ROM which decodes the commands written into the command register and generates various micro commands or control signals; an operational circuit; a general-purpose register (RG6 and the like); a bus driver which is connected with the internal bus (BUS); and a bus receiver.

The CPU reads a command from the read only memory and operates according to that command. It performs the following functions: to receive external data sent via the input-output circuit I/O, to send data to, or receive data from, the control circuit ULC; to read commands from the ROM or fixed data necessary for execution of commands; to send data for D/A conversion to the D/A converter DAC; to read A/D-converted data from the A/D converter; to read data from, or write data to, the static memory SRAM and dynamic memory DRAM; to control the DMA controller DMAC and so on. The control bus CBUS is used for the CPU to control the operation of the circuit blocks indicated in the figure, and also is used to send status command signals from circuit blocks such as the DMAC to the CPU.

The CPU refers to operation control signals set on the command register RG5 and the like in the interruption control circuit IVC via the internal bus and performs the necessary process. It receives the system clock signal C2 from the clock generating circuit CGC and operates according to the operational timing and cycle determined by that signal.

The main internal portion of the CPU comprises CMOS circuitry that consists of a PMOS and an NMOS. Nonlimitatively, the CMOS circuitry constituting the CPU incorporates a CMOS static logic circuit (not indicated), a CMOS static circuit like a CMOS static flip-flop which can operate statically, and a CMOS dynamic circuit which performs the precharge and signal output to the signal output node synchronously with the system clock signal C2.

The CPU becomes inactive if the system clock signal C2 from the clock generating circuit CGC is stopped. With the CPU inactive, the output signal in the dynamic circuit is modified in an unwanted manner by an unwanted leakage current. A circuit like a static flip-flop register holds the data received so far even while no system clock signal is being supplied.

While the system clock signal C2 is not being supplied, in the CPU, signal level transition at various nodes in the internal static circuit, and discharge or precharge at the output node in the dynamic circuit are discontinued. In this condition, a relatively large current consumption like the operating current consumed by the active CMOS circuit, or the charge or discharge current given by the supply line for signal displacement in stray or parasitic capacitors in various nodes and wiring to the nodes, changes to virtually zero. This means that only a small current almost equal to the leakage current in the CMOS circuit flows through the CPU, leading to low power consumption.

(Interruption Control Circuit IVC)

In the interruption control circuit IVC, a reset signal like the negative logic level is received through external terminal T1, a first operation signal CMQ is received through external terminal T3, a second operation control signal CPMQ is received through external terminal T4, and the status command signal to specify the operational status of the semiconductor integrated circuit device is sent to external terminal T2. The IVC has register RG5 whose bits are set according to said reset signal RESB, operation control signals CMQ and CPMQ and a status command signal.

The status command signal in RG5 is updated through the internal bus (BUS) by the CPU. Operation control signals CMQ and CPMQ set on RG5 through T3 and T4 are referred to by the CPU through the internal bus as mentioned above.

Nonlimitatively, the interruption control circuit IVC incorporates a refresh address counter (not indicated) to refresh the dynamic memory. This refresh address counter in the IVC is stepped according to the system clock signal from the clock generating circuit CGC to generate periodically updated refresh address information if the first or third mode is commanded by first or second operation control signal CMQ or CPMQ, or the command for the operation mode or operation standby mode is given to the semiconductor integrated circuit device.

(Clock Generating Circuit CGC)

The clock generating circuit CGC receives an external clock signal CLK through external terminal T5 and generates a cyclic system clock signal C2 synchronized with that signal. It should be noted that the system clock signal C2 is a multi-phase signal like clock signals for ordinary processors, which ensures sequential operation of the other non-indicated circuits within the CPU, though in FIG. 7, the signal line between the CGC and CPU is indicated in a simplified form.

Generation of system clock signal C2 by the clock generating circuit CGC is controlled by control signal C1 such as mode signal MODE2 and initialize signal INTL, and control signal C3 from the CPU, where the signals MODE2 and INTL respond to first and second operation control signals CMQ and CPMQ from the interruption control circuit IVC. If "full-standby" is requested by operation control signal CMQ, the CPU performs the processing operation necessary for a shift to the full-standby status including writing onto the static memory SRAM of data to be statically held, and then it generates control signal C3 to stop generation of the system clock signal for the clock generating circuit CGC.

If "operation standby" is requested by operation control signal CPMQ, as in the above case of full-standby, the CPU performs a processing operation necessary for a shift to the operation standby status including writing onto the static memory SRAM of data to be statically held, and then, unlike the above case, generates control signal C3 for selective output of a system clock signal for the clock generating circuit CGC.

In other words, the supply of system clock signals from the clock generating circuit to the interruption control circuit IVC and dynamic memory DRAM is continued while the supply of system clock signals to the other circuit blocks is discontinued. If operation control signal CMQ or CPMQ turns into a signal to request a circuit operation, the clock generating circuit CGC is controlled by control signal C1 from IVC which responds to that signal, so that CGC generates system clock signal C2 in response to external clock signal CLK.

(Input-Output Circuit I/O)

The input-output circuit I/O receives external signals through desired external terminal TIO1 or TION and also receives, through the internal bus (BUS), signals to be output to desired external terminal TIO1 or TION. The I/O incorporates a control register RG4 and a data register (not indicated) both of which consist of CMOS static circuitry.

Control register RG4 is selected by the CPU and given, from the CPU, control data for the input-output circuit I/O such as data input/output commands and high power impedance status commands. The data register is used for data transfer between external terminal TIO1 or TION and the internal bus (BUS). If the bit length of external terminal TIO1 or TION or the number of terminals is different from that of the internal bus (BUS), the data register changes its number of bits according to the operation control by the CPU to suit the larger bit length.

For example, if the number of terminals for external terminal TT01 or TION is 64 and the bit length of the internal bus is 256 bits, serial data which is successively sent to external terminal TIO1 or TION by steps of 64 bits is sent successively to the data register according to the serial-parallel data conversion control by the CPU for conversion into 256-bit data. Inversely, the 256-bit data set on the data register through the internal bus is divided into four sets of 64-bit data which are then successively sent to external terminal TIO1 or TION.

In the input-output circuit I/O, input and output operation of its signal input and output circuits is controlled by the system clock signal. Therefore, when no system clock signal is sent to I/O, I/O's power consumption is low as in the case of the CPU.

(Control Circuit ULC)

A control circuit ULC is provided as needed by each electronic system. Examples of such control circuit are: circuits for motor servo control, head tracking control or error correction in hard disk drives; circuits for image or audio data compression/decompression in audio visual apparatus and so on. ULC is controlled according to system clock signals as the CPU is.

(Read Only Memory ROM)

As mentioned earlier, the ROM stores commands and fixed data to be read and executed by the CPU.

(Digital/Analog Converter DAC)

The digital/analog converter DAC has a register RG2 which receives digital data for conversion into analog signals via the internal bus, and generates analog signals according to such digital data. On RG2, digital data is set by the control circuit ULC or CPU. Digital-to-analog conversion timing including conversion start timing and output timing is controlled by the system clock signal. Nonlimitatively, the analog signal generated by DAC is sent to desired external terminal TIO1 or TION via the internal bus and I/O. In this case, external terminal TIO1 or TION is used as a terminal (pin) for both input and output, but an input terminal and an output terminal may be separately provided.

When high precision digital-to-analog conversion is required, the digital/analog converter DAC should be provided with a reference voltage or current source for analog quantization, though these details are not illustrated. Such reference voltage or current source is considered to constitute a kind of analog circuit, which involves the risk that non-negligible current consumption may occur in the 2nd (full-standby) and 3rd (operation standby) modes. In order to avoid such current consumption, a MOSFET switch is provided to turn off the reference voltage or current source in the 2nd and 3rd modes.

(Analog/Digital Converter ADC)

The analog/digital converter ADC receives an analog signal which has been sent through desired external terminal TIO1 or TION and through the input-output circuit I/O and internal bus, and the start of its analog-to-digital conversion is controlled by the control circuit ULC or CPU; said analog signal is converted into a digital signal under the control of system clock signal C2 and the digital signal thus obtained is set on register RG1.

As in the above digital-to-analog conversion, when high precision analog-to-digital conversion is required, ADC should be provided with a reference voltage or current source for digital quantization. The reference voltage or current source in the ADC also involves the risk that nonnegligible current consumption may occur in the full-standby and operation standby modes. In order to avoid such current consumption, a MOSFET switch should be provided to turn off the reference voltage or current source as in analog-to-digital conversion.

(Static Memory SRAM)

Static memory SRAM has CMOS static memory cells, or memory cells which consist of CMOS latch circuitry and a pair of transmission gate MOSFETs for data input from it and data output to it, though their details are not indicated. The distinct feature of CMOS static memory cells is to statically hold information and require only very small current to hold information.

Such static memory substantially constitutes a CMOS static random access memory. This means that the SRAM includes: a memory array consisting of a matrix of CMOS static memory cells; a row address decoder & driver which selects the word line in the memory array by decoding the row address signal supplied through the internal bus; a column address decoder which generates a column decode signal by decoding the column address signal; a column switcher which is activated by such column decode signal to select the data line in the memory array and combine it with a common data line; an input-output circuit connected to the common data line; and a read/write control circuit.

A memory array peripheral circuit such as the address decoder & driver consists of CMOS static circuitry. Therefore, if the SRAM is only to hold information without reading and writing, its power consumption is relatively small. The following feature of the CMOS static memory should be taken into consideration: its memory cell size is relatively large, resulting in a relatively large overall size for its capacity. This means that it is comparatively difficult to have a large storage capacity.

(Direct Memory Access Controller DMAC)

Controlled by the CPU, direct memory access controller DMAC controls data transmission via the internal bus (BUS) between the circuit blocks specified by the CPU, on behalf of the CPU. Details of the DMAC are not explained here because it can be virtually the same in configuration as a direct memory access controller treated as an independent semiconductor integrated circuit device. It controls data transmission according to the information set by the CPU on internal register RG7 and so on including source information, destination information and data transmission volume information.

(Dynamic Memory DRAM)

Typically, the dynamic memory DRAM has dynamic memory cells that consist of a small number of devices including information storage capacitors to store information as an electric charge, and selective MOSFETS, so that the memory cell size can be relatively small. The dynamic memory, therefore, can be relatively small in size even if its capacity is large. The DRAM will be further explained with reference to FIG. 8.

Figure 8:
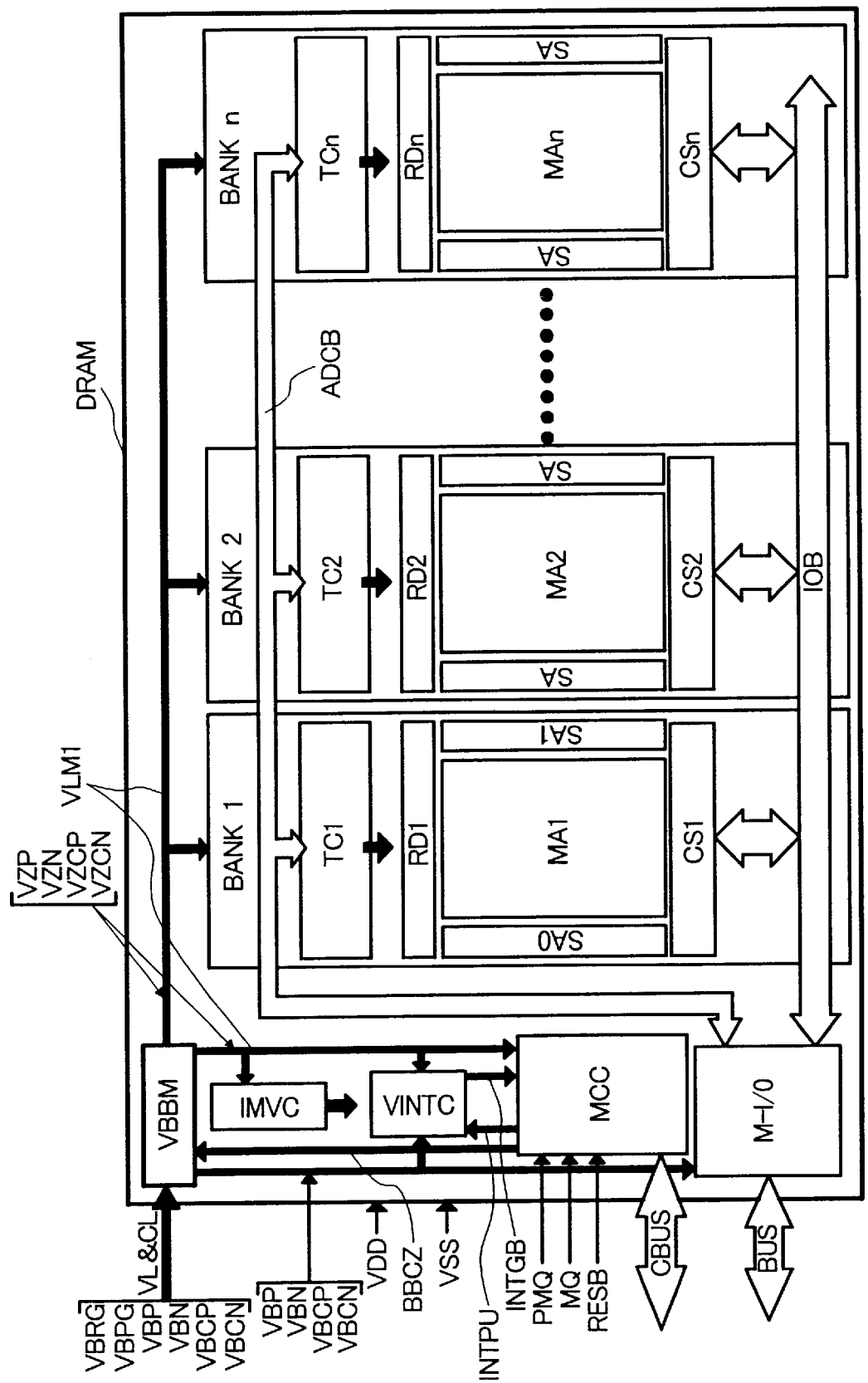
FIG. 8 is a block diagram showing an embodiment of a dynamic RAM to be mounted on semiconductor integrated circuit devices to which this invention is applied.

FIG. 8 shows a block diagram of an embodiment of the dynamic memory (hereafter called DRAM) mounted on the semiconductor integrated circuit device according to this invention. This DRAM constitutes a module or functional unit in the above system LSI (semiconductor integrated circuit device).

Nonlimitatively, the DRAM as shown here uses memory banks to provide a large memory capacity. The number of memory banks used can be varied and, for example, up to 16 memory banks can be mounted. In this instance, BANK1 comprises a memory cell array MA1, sense amplifiers SA0 and SA1 integrated with bit line prechargers (not indicated), a timing generating circuit and a column selector TC1, a row decoder RD1 and a column switcher CS1.

In these memory banks, an address bus/control bus, ADCB, is provided for address and control signals and a memory internal bus (I/O internal bus), IOB, is provided for data input/output. For ADCB and IOB, a common memory input-output circuit, M-I/O, is provided. M-I/O incorporates a port connected with the internal bus (BUS) as shown in FIG. 13.

The DRAM comprises: VBBM, a substrate voltage select circuit connected with substrate bias control circuit VBBC via line group VL&CL; IMVC, an internal power supply circuit; MMC, a memory control circuit which receives various operation control signals via control bus CBUS as well as internal operation control signals MQ and PMQ and reset signal RESB; and VINTC, a power supply initializing circuit. The IMVC also contains charge pump circuitry such as the boosting circuit and negative voltage generating circuit as mentioned earlier.

For convenience in automating the design work for semiconductor integrated circuit devices, it is possible to treat a package composed of many devices as composed of a smaller number of device groups. All devices in one memory bank—for instance, a memory array (MA1), sense amplifiers (SA1 And SA2), row decoder (RD1) and column switch (CS1)—can be treated as a single memory mat, and the timing generating circuit and column selector (TC1) can be considered to constitute a bank control circuit. In this case, each memory bank can be considered to consist simply of a memory mat and a bank control circuit.

In the DRAM as indicated, said memory mat, its selection circuit and so on are almost equal to those of a known DRAM which constitutes an independent CMOS semiconductor integrated circuit device. Its internal structure is not discussed here for this reason, but its outline is given below.
(Memory Cell Arrays MA1–MAn)

A memory cell array like MA1 includes a matrix of dynamic memory cells, word lines connected with corresponding memory cell selection terminals and bit lines connected with corresponding memory cell data input/output terminals.

A selective MOSFET which constitutes a memory cell has P-type well region PWELL1 on a semiconductor substrate made of P-type monocrystal silicon, with N-type source and drain regions formed on the PWELL1. Nonlimitatively, it is electrically isolated from the semiconductor substrate by means of an N-type isolation semiconductor region with a comparatively low impurity level. Said isolation region is made to have a positive potential like supply terminal VDD. Said N-type isolation semiconductor region protects the P-type well region PWELL1 against undesirable carriers which may be generated in P-type semiconductor substrates due to alpha particles.

The P-type well region PWELL1 in which a memory cell is formed is given negative substrate voltage VBB which is generated by the internal power supply circuit IMVC in the DRAM. This decreases tailing or leakage current of a selective MOSFET in the memory cell, thereby reducing information leakage in the memory cell information storage capacitor.

On P-type well region PWELL1, an information storage capacitor in the memory cell is provided through an insulation film consisting of silicon oxide film. One electrode of this capacitor is electrically connected to the electrode considered as the source region for the selective MOSFET. The other electrode of each of the information storage capacitors in the memory cells is a common electrode called a "plate electrode." The plate electrode is given the prescribed potential VP1 as a capacitive electrode.

It is desirable that information storage capacitors are small enough to make a small memory cell array and, on the other hand, have enough capacity to hold information for a long time. In this kind of capacitor, the dielectric film between its electrodes is usually made of a material with a comparatively large dielectric constant such as tantalate or silicon oxide and is made very thin in order to increase the capacity per unit area. The plate electrode potential VPL for information storage capacitors is a medium potential which is equal to half the circuit supply voltage VDD which is generated by the voltage converter IMVC.

In this condition, one electrode of the information storage capacitor is supplied with either a high level potential like supply voltage VDD or a low level potential like circuit grounding potential depending on the information to be stored, but in either case, the plate electrode potential VPL is almost half the supply voltage VDD. In other words, the voltage applied to the dielectric film is limited to a very low level almost equivalent to one half of VDD. This makes it possible to lower the dielectric film withstand voltage and reduce undesirable leakage current caused by a decrease in the applied voltage, allowing for minimization of its thickness.
(Timing Generator & Column Selector)

A timing generator & column selector like TC1 is controlled by operation control signals from the global controller in the memory control circuit MCC and activated or selected by the bank select signal supplied via bus ADCB, generating various internal timing signals to control the bit line precharger for the memory array, row decoder, sense amplifiers, its own internal column selector and other circuits. Controlled by the internal timing signal, the column selector decodes the column address signal sent via ADCB and generates the decode signal to activate the column switcher for the bank concerned such as column switcher CS1.

The operational timing of a row decoder like RD1 is controlled by the timing signal supplied from the timing generator & column selector; and it decodes the address signal supplied via ADCB and selects the word line in the corresponding memory cell.

Before row decoder activation, the bit line precharger is activated by the precharge timing signal, precharging each bit line in the corresponding memory cell array to almost one half of the supply voltage VDD.
(Sense Amplifiers)

After row decoder activation, sense amplifiers like SA0 and SA1 are activated by the sense amplifier timing signal generated by the timing generator & column selector TC1, amplifying the read signal, a signal given to the bit line by the memory cell selected by the row decoder. The unit sense amplifiers which correspond to the sense amplifier bit lines each have virtually the same structure as well-known CMOS sense amplifiers.

Each unit sense amplifier has a pair of PMOSs with a cross-connected gate and drain and a pair of NMOSs with a cross-connected gate and drain. The pair of PMOS drains and the pair of NMOS drains are connected to the corresponding pair o f bit lines. On the other hand, the pair of PMOS sources are in common connection and given an operating potential through the switch MOSFET controlled by the sense amplifier timing signal. Likewise, the pair of NMOS sources are in common connection and given a circuit grounding potential as an operating potential through the switch MOSFET controlled by the sense amplifier timing signal.

As said operating voltage, for example, supply voltage VDD corresponding to the bit line "high level," or higher boosted voltage VBS is used. For a certain period from when the sense amplifier starts amplification until the potential of the bit line to be brought to the "high" level reaches the desired voltage level, amplification is made through said boosted voltage VBS (override method). As said bit line potential almost reaches the desired potential VDD, the sense amplifier operating voltage is switched to the supply voltage VDD which corresponds to the initially intended bit line high level.

The two sense amplifiers with a memory cell array between them are arranged as follows: the sense amplifier at one end of the memory cell array is connected with alternate bit lines of the memory cell array and the sense amplifier at the other end of the memory cell array is connected with the remaining alternate bit lines. This arrangement is effective in minimizing the interval between bit lines in the memory cell array when MOSFETs in the sense amplifier must be arranged at relatively large intervals.

(Column Switcher)

A column switcher like CS1 is activated by the selection signal output from the corresponding column selector. In the column switcher, the column selector selects a bit line from among the bit lines in the memory cell array and the bit line is connected to memory internal bus IOB.

(Memory Input-Output Circuit M-IO)

The memory input-output circuit M-IO, which is connected to the internal bus (BUS) in the semiconductor integrated circuit device, receives an address signal and a control signal from said bus and transmits them to the internal bus ADCB. M-IO carries out memory data input and output between BUS and IOB.

(Memory Control Circuit MCC)

Memory control circuit MCC receives internal first and second operation control signals MQ and PMQ and reset signal RESB and performs control according to these signals. Nonlimitatively, the MCC has two circuits: the first control logic circuit MSW which receives first and second operation control signals MQ and PMQ and generates internal operation control signal BBCZ based on the signals, and the second control logic circuit V.INT which receives first operation control signal MQ and reset signal RESB and generates substantial initialization control signal INTGB.

(Substrate Voltage Select Circuit VBBM)

Substrate voltage select circuit VBBM receives various bias voltages (VBP, VBN, VBPG, VBNG) and control signals (VBCD, VBCN) via line group VL&CL from substrate bias control circuit VBBC; and it also receives control signal BBCZ from MCC and supplies bias voltages to the required circuit within DRAM under the control of these bias voltages and control signals.

(Voltage Converter MVC)

Voltage converter IMVC receives the supply voltage provided between power supply terminal VDD and reference potential terminal VSS of DRAM and generates the following internal voltages as mentioned above: substrate voltage VBB for the memory cell array, plate voltage VPL, boosted voltage to set the word line selection level, VDH, and boosted voltage for sense amplifier overdrive, VBS. Nonlimitatively, substrate voltage VBB for the memory cell array is generated within this IMVC of DRAM as a module.

The circuit for generating negative potential bias voltage VBB and boosted voltages VDH and VBS is designed to generate the desired negative voltage even at low supply voltage as mentioned above.

Since the information signal read from the dynamic memory cell is very small, the configuration of this embodiment, where substrate voltage VBB is independently generated, is effective in suppressing the potential fluctuation of P-type well region PWELL1 to avoid disturbing the small signal. In the circuit which generates such substrate voltage VBB, undesirable leakage current from the memory cell array into PWELL1 is usually small so that the output capacity requirement is relatively low, allowing the circuit's power consumption to be sufficiently low.

(Power Supply Initializing VINTC)

Power supply initializing circuit VTNTC initializes the DRAM circuitry under the control of the memory control circuit MCC. Detailed explanation of the configuration of the power supply initializing circuit VINTC and its initializing operation is omitted here because they are not directly associated with this invention.

In the descriptions made so far, the term "MOS" is generally known as an abbreviation for metal oxide semiconductor. However, the recent trend is that MOS includes semiconductor devices which use non-metal conductive material such as polysilicon instead of metal in their substantial parts or use other insulating material instead of oxide. Also there is a growing tendency to understand CMOS, in a broader sense to parallel the change in the meaning of MOS as mentioned above. Likewise, the trend is that MOSFET is understood not in a limited sense, but more broadly or is as an insulated-gate field-effect transistor. In this invention, CMOS, MOSFET and other similar abbreviations are used in such a broader sense.

Figure 9:
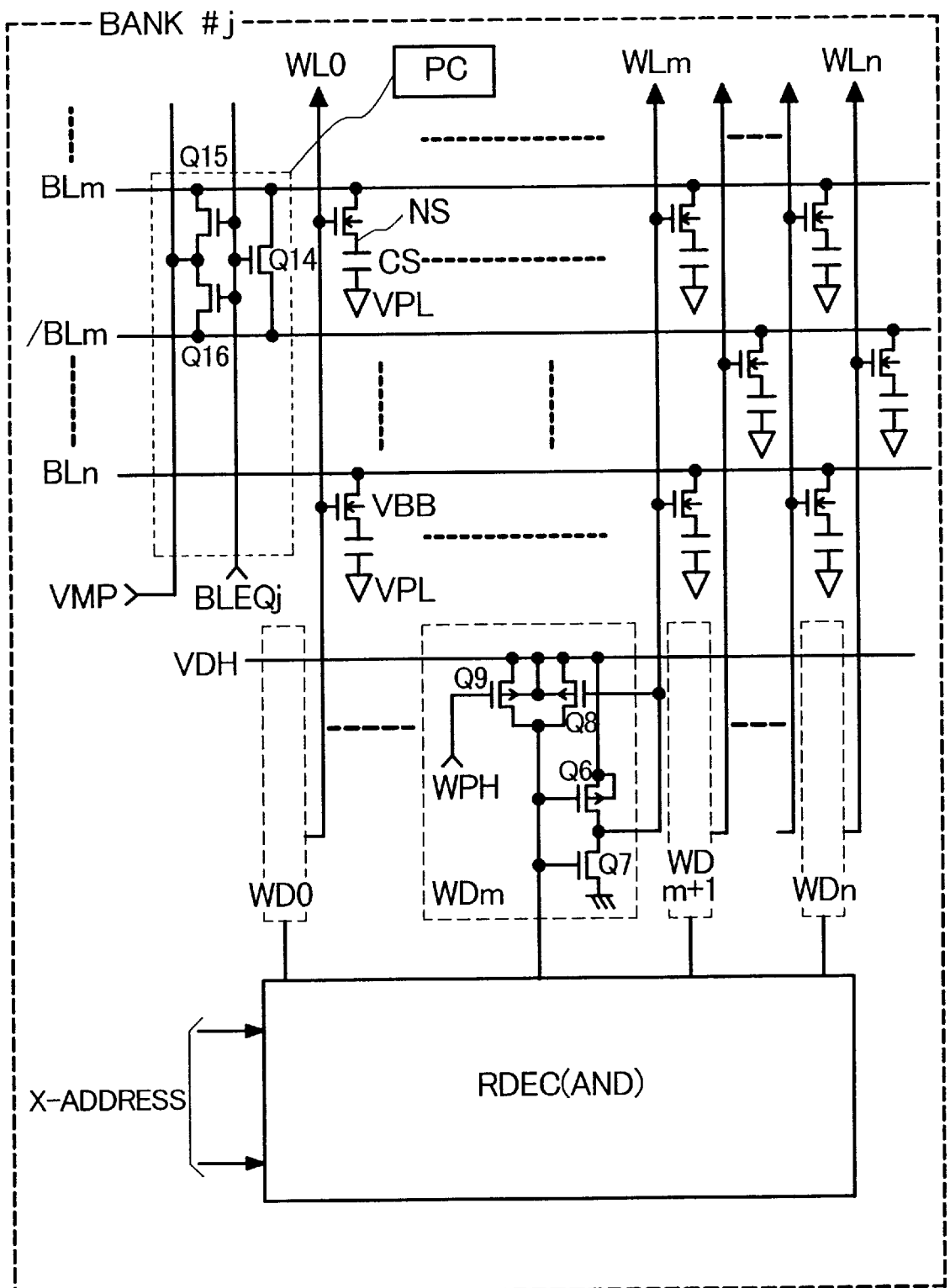
FIG. 9 is a circuit diagram showing an embodiment of the memory cell array of the dynamic RAM shown in FIG. 8.
Figure 10:
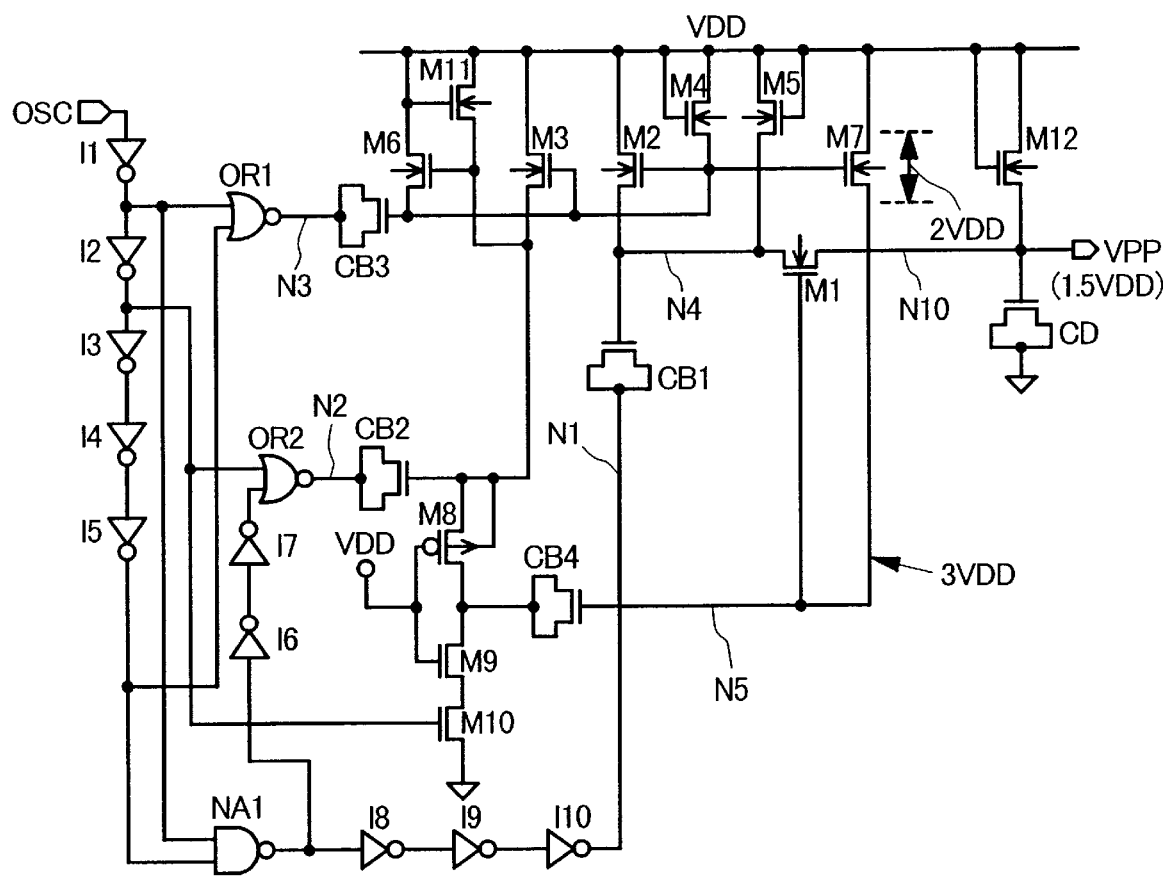
FIG. 10 is a circuit diagram showing an example of a voltage boosting circuit conceived prior to this invention.

FIG. 9 shows a circuit diagram of an embodiment of said memory cell array and word line selection circuit. This figure also includes the equalize & precharge circuit for the bit lines in the memory cell array. In the figure, as a memory mat, bank address #j among said bank addresses #0-#n is shown as a typical example. Among complementary bit lines and word lines provided in bank (memory mat) #j, one pair of complementary bit lines BLm and /BLm and one bit line BLn as well as word lines WLO, WLm, WLm+1 and WLn are shown as typical examples.

The memory bank will be explained next by taking as an example the memory cell provided at the intersection of word line WLO and bit line BLm. The gate of address selection MOSFET Qm is connected to the word line. The source & drain at one end of said MOSFET Qm is connected to bit line BLm while the source & drain at the other end is connected to storage node NS as one electrode of storage capacitor CS. The other electrode of CS is also used as one electrode of a storage capacitor of another memory cell and is supplied with plate voltage VPL.

The above memory cell is located at the intersection of a word line and either of the complementary bit lines. Take as an example word line WLM and a line next to it, WLm+1. A memory cell is provided at the intersection of WLm and either of the complementary bit lines, BLm, while another memory cell is located at the intersection of WLm+1 and the other complementary bit line /BLm. In this way, memory cells are each alternately located at the intersection of one even-numbered or odd-numbered word line with one complementary bit line or the other and so on. Another approach may be that two memory cells are provided for each pair of neighboring word lines, with a set of two memory cells being alternately located at the intersection of one such pair with one complementary bit line or the other.

On said bit lines BLm and /BLm are n-channel type MOSFETs Q14–Q16 which constitute an equalize & precharge circuit PC. MOSFET Q14 shorts complementary bit lines BLm (high or low level) and /BLm (low or high level) to set half potential. MOSFETs Q15 and Q16 are intended to prevent fluctuation in the half potential set by the above short-circuit of BLm and /BLm due to leakage current and so on and sends half precharge voltage VMP to BLm and /BLm. The gates of MOSFET Q14–Q16 are connected in common and given precharge & equalize signal BLEQj. In other words, after a word line is reset from the selection level to the non-selection level, said signal BLEQj becomes a "high" level signal and turns on MOSFET Q14–Q16 to precharge and equalize BLm and /BLm.

For said word lines WL0-WLn, word line drive circuits WD0-WDn are provided. In FIG. 9, word line drive circuit WDm for word line WLm is shown as an example. WDm employs CMOS inverter circuitry which comprises p-channel type MOSFET Q6 with its source connected to the power supply VDH boosted by said boosting circuit, and n-channel type MOSFET Q7 with its source connected to circuit grounding potential. The drains of MOSFET Q6 and Q7 are connected to make up an output terminal to be connected with WLm. The gates of MOSFET Q6 and Q7 are connected to make up an input terminal to be supplied with the selective signal generated by row (X) decoder RDEC.

Between the input terminal of said CMOS inverter circuit (Q6 and Q7) and said boosted voltage VDH, p-channel type MOSFET Q9 for precharge with its source and drain connected and p-channel type MOSFET Q8 for non-selective latch are arranged in parallel. The gate of MOSFET Q8 for non-selective latch is connected to the output terminal of said CMOS inverter circuit (Q6 and Q7). The gate of MOSFET Q9 is supplied with precharge signal WPH. This precharge signal WPH is generated by the signal generating circuit which uses said boosted voltage VDH as operating voltage to generate high level signals for word line selection and low level signals like circuit grounding potential.

Said MOSFET Q14 is a level limiter MOSFET. If non-indicated sense amplifiers operate at supply voltage VDD, the high level potential of complementary bit line BLm or /BLm matches supply voltage VDD and said boosted voltage VDH is made VDD+VTH. Here, VTH denotes the threshold voltage of address selection MOSFET Qm. This makes it possible to send, to capacitor CS without level loss, a high level signal like supply voltage VDD for BLm or /BLm amplified by sense amplifier.

The advantages of the above embodiments are as follows:
(1) One advantage is to provide an internal voltage generating circuit in which a voltage two or more times higher than the operating voltage can be obtained and at the same time the voltage applied to devices is reduced to ensure the device reliability, wherein a combination of charge pump circuits each consisting of a drive circuit which generates a pulse signal to match the operating voltage and a capacitor charged up by the thus generated pulse signal constitutes an internal power supply generating circuit with its internal nodes whose voltage difference is two or more times as high as said operating voltage; wherein a MOSFET for voltage relaxation of the same conduction type as the MOSFET used for the above-mentioned voltage generation is inserted in series between the internal nodes where a potential difference two or more times as high as said operating voltage is present, and wherein the gate of such MOSFET for voltage relaxation is supplied with a voltage that matches the above voltage generation and is lower than the drain voltage concerned by an amount equivalent to said operating voltage.

(2) Another advantage is to provide said internal voltage generating circuit in which only a low voltage almost equivalent to the operating voltage is applied between the source and drain of each MOSFET, wherein a voltage doubler circuit is made up of a first charge pump circuit consisting of a first drive circuit and first capacitor, and a second drive circuit is driven by the boosted voltage generated by said voltage doubler circuit, and a voltage tripler circuit is made up of a second charge pump circuit consisting of a second capacitor, the first MOSFET and second MOSFET being connected in series at the output side of said second charge pump circuit capacitor and the operating voltage terminal, wherein said first MOSFET precharges said second capacitor to the level of the operating voltage and the said doubled voltage is applied to the gate of said second MOSFET.

(3) A third advantage is to provide said internal voltage generating circuit in which at the first timing, capacitors are precharged to match said operating voltage and at the second timing, said capacitors are connected in series to generate a voltage two or more times as high as said operating voltage; the MOSFET for precharge of said capacitors and the MOSFET for voltage relaxation (at which gate a small voltage equivalent to said operating voltage is applied) being connected in series between the node with said multi-fold voltage and the grounding potential and between the supply voltage and the point of serial connection of said capacitor so that a high voltage is generated while only a low voltage almost equivalent to the operating voltage is applied between the drain and source of each MOSFET.

(4) A fourth advantage is to provide said internal voltage generating circuit in which a charge pump circuit which performs precharge at the first timing and generates a negative voltage to match the operating voltage at the second timing is also provided, the first and second capacitors being precharged with a positive voltage matched to said operating voltage at the first timing and said first and second capacitors being connected in series at the second timing to generate a negative voltage equivalent to twice said operating voltage with respect to a grounding potential and to generate a control signal for p-channel type rectifier MOSFET, wherein said p-channel type rectifier MOSFET is turned off with the precharge voltage generated at said first timing and turned on with said doubled negative voltage for efficient generation of negative voltage in said charge pump circuit.

(5) A fifth advantage is to provide a semiconductor integrated circuit device incorporating a dynamic RAM which operates stably even at low voltage, the dynamic RAM comprising dynamic memory cells and sense amplifiers, the memory cells consisting of storage capacitors where there are word lines and pairs of complementary bit lines and an address selection MOSFET is provided between one such word line and one complementary bit line of said pair with its gate connected to said word line and its source and drain at one end connected to one bit line of said pair while the drain and source at the other end of said address selection MOSFET are connected to one electrode and a prescribed voltage is applied to the other electrode; the sense amplifiers consisting of: pairs of p-channel type MOSFETS which constitute an amplifying section on the operating voltage side with said cross-connected gates and drains connected with said pairs of complementary bit lines respectively; and pairs of n-channel MOSFETs which constitute an amplifying section on the operating voltage side and said cross-connected gates and drains being connected with said pairs of complementary bit lines, wherein the gate of said address selection MOSFET is connected to the word line whose selection level voltage is generated by said boosting circuit.

Though this invention has been concretely explained above according to the embodiments, the invention is not limited to the above embodiments and it is needless to say that the invention may be embodied in other specific forms without departing from its spirit. For example, the voltage boosting circuit can be used not only for generation of said dynamic memory cell word selection voltage but also for generation of a necessary voltage higher than the operating voltage. The negative voltage can be used as a substrate voltage given to the substrate gate where a dynamic memory cell is formed, or as operating voltage for an analog circuit such as an operational amplifying circuit which runs at both positive and negative voltages. This invention can be widely used in semiconductor integrated circuit devices having internal nodes whose potential difference is made two or more times as high as operating voltage, by charge pump circuits.

The advantages brought about by typical embodiments of the invention are summarized as follows. It is possible to provide an internal voltage generating circuit in which a voltage two or more times as high as the operating voltage can be obtained and at the same time the voltage applied to the devices is reduced to ensure the device reliability, provided that a combination of charge pump circuits each consisting of a drive circuit which generates a pulse signal to match the operating voltage and a capacitor charged up by the thus generated pulse signal produces an internal power supply generating circuit with its internal nodes whose voltage difference is two or more times as high as said operating voltage; wherein a MOSFET for voltage relaxation, of the same conduction type as the MOSFET used for the above-mentioned voltage generation, is inserted in series between the internal nodes where a potential difference two or more times as high as said operating voltage is generated, and the gate of such MOSFET for voltage relaxation is supplied with a voltage that matches the above voltage generation and is lower than the drain voltage concerned by an amount equivalent to said operating voltage.

I claim:

1. A semiconductor integrated circuit device comprising:
   first and second MOSFETs including source-drain current paths thereof connected in series between first and second nodes, the first node being connected to receive a first potential;
   third and fourth MOSFETs including source-drain current paths thereof connected in series between third and fourth nodes, the third node being connected to receive the first potential;
   a first charge pump circuit including an output thereof connected to the second node;
   a second charge pump circuit including an output thereof connected to the fourth node;
   a third charge pump circuit including an output thereof connected to the first charge pump circuit;
   a fourth charge pump circuit including an output thereof connected to the second charge pump circuit;
   a first rectifier MOSFET including a source-drain current path thereof connected between the second node and a fifth node; and
   a second rectifier MOSFET including a source-drain current path thereof connected between the fourth node and the fifth node,
   wherein the first charge pump circuit outputs a first signal which varies between a high level and a low level alternately and periodically,
   wherein the second charge pump circuit outputs a second signal which varies between a high level and a low level alternately and periodically, the high level of the second signal is equal in amplitude to the high level of the first signal,
   wherein the third charge pump circuit outputs a third signal which varies between a high level and a low level alternately and periodically, the high level of the third signal has a lower amplitude than the high level of the first signal,
   wherein the fourth charge pump circuit outputs a fourth signal which varies between a high level and a low level alternately and periodically, the high level of the fourth signal is equal in amplitude to the high level of the third signal,
   wherein a gate of the first MOSFET is controlled by a fifth signal, and a gate of the third MOSFET is controlled by a sixth signal,
   wherein gates of said second and fourth MOSFETs are mutually coupled,
   wherein an input of the third charge pump circuit is connected to an input of the first charge pump circuit, and an input of the fourth charge pump circuit is connected to an input of the second charge pump circuit,
   wherein the high level of the first and second signals, respectively, is three times the magnitude of the first potential, and
   wherein the high level of the third and fourth signals, respectively, is twice the magnitude of the first potential.

2. A semiconductor integrated circuit device according to claim 1,
   wherein each of the first and second rectifier MOSFETs is a p-channel type MOSFET.

3. A semiconductor integrated circuit device according to claim 1,
   wherein said first rectifier MOSFET further includes a gate thereof connected to the second charge pump circuit,
   wherein the second rectifier MOSFET further includes a gate thereof connected to the first charge pump circuit, and
   wherein the gates of the first and second rectifier MOSFETs receive complementary voltages.

4. A semiconductor integrated circuit device according to claim 3,
   wherein each of the first and second rectifier MOSFETs is a p-channel type MOSFET.

5. A semiconductor integrated circuit device according to claim 4,
   wherein when the first signal is at the high level, the second signal is at the low level, and when the first signal is at the low level, the second signal is at the high level.

6. A semiconductor integrated circuit device according to claim 1, wherein the high level and low level of the first through fourth signals are positive voltages, respectively.

7. A semiconductor integrated circuit device according to claim 6, wherein the first potential represents the operating voltage for powering the circuit device.

8. A semiconductor integrated circuit device according to claim 1, wherein the first charge pump circuit includes a first complementary MOSFET circuit an input of which is coupled to receive a first phase of an input signal of the circuit device, and a first boosting capacitor coupled between an output of the first complementary MOSFET circuit and the second node, and wherein the second charge pump circuit includes a second complementary MOSFET circuit an input of which is coupled to receive a second, complementary phase of said input signal of the circuit device, and a second boosting capacitor coupled between an output of the second complementary MOSFET circuit and the fourth node.

9. A semiconductor integrated circuit device according to claim 8, wherein the third and fourth charge pump circuits include a complementary MOSFET circuit with a boosting capacitor at an output side thereof, respectively, and wherein the third and fourth charge pump circuits have inputs coupled to the inputs of the first and second charge pump circuits, respectively, and have outputs connected via a source-drain path of first and second transfer MOSFETs to the gate of the second and fourth MOSFETs, respectively.

10. A semiconductor integrated circuit device according to claim 1, wherein the third and fourth charge pump circuits include a complementary MOSFET circuit with a boosting capacitor at an output side thereof, respectively, and wherein the third and fourth charge pump circuits have inputs coupled to the inputs of the first and second charge pump circuits, respectively, and have outputs connected via a source-drain path of first and second transfer MOSFETs to the gate of the second and fourth MOSFETs, respectively.

11. A semiconductor integrated circuit device according to claim 7, wherein the first and third MOSFETs are applied with complementary voltages at gates thereof.

12. A semiconductor integrated circuit device according to claim 1, wherein the first and third MOSFETs are applied with complementary voltages gates thereof.

13. A semiconductor integrated circuit device according to claim 14, wherein the first and third MOSFETs are applied with complementary voltages at gates thereof.

14. A semiconductor integrated circuit device according to claim 10, wherein the first and third MOSFETs are applied with complementary voltages at gates thereof.

15. A semiconductor integrated circuit device comprising:

first and second MOSFETs including source-drain current paths thereof connected in series between first and second nodes, the first node being connected to receive a first potential;

third and fourth MOSFETs including source-drain current paths thereof connected in series between third and fourth nodes, the third node being connected to receive the first potential;

a first charge pump circuit including an output thereof connected to the second node;

a second charge pump circuit including an output thereof connected to the fourth node;

a third charge pump circuit including an output thereof connected to the first charge pump circuit;

a fourth charge pump circuit including an output thereof connected to the second charge pump circuit;

a first rectifier MOSFET including a source-drain current oath thereof connected between the second node and a fifth node; and a second rectifier MOSFET including a source-drain current path thereof connected between the fourth node and the fifth node, wherein the first charge pump circuit outputs a first signal which varies between a high level and a low level alternately and periodically, wherein the second charge pump circuit outputs a second signal which varies between a high level and a low level alternately and periodically, the high level of the second signal is equal in amplitude to the high level of the first signal, wherein the third charge pump circuit outputs a third signal which varies between a high level and a low level alternately and periodically, the high level of the third signal has a lower amplitude than the high level of the first signal, wherein the fourth charge pump circuit outputs a fourth signal which varies between a high level and a low level alternately and periodically, the high level of the fourth signal is equal in amplitude to the high level of the third signal, wherein a gate of the first MOSFET is controlled by a fifth signal, and a gate of said third MOSFET is controlled by a sixth signal, wherein gates of said second and fourth MOSFETs are mutually coupled, wherein a gate of the first rectifier MOSFET is connected to the second charge pump circuit, and a gate of the second rectifier MOSFET is connected to the first charge pump circuit, wherein the gates of said first and second rectifier MOSFETs receive complementary voltages, wherein said first and second rectifier MOSFETs are p-channel type MOSFETs, respectively, wherein when the first signal is at the high level, the second signal is at the low level, and when the first signal is at the low level, the second signal is at the high level, wherein the high level of the first and second signals, respectively, is three times the magnitude of the first potential, and wherein the high level of the third and fourth signals, respectively, is twice the magnitude of the first potential.

16. A semiconductor integrated circuit device according to claim 15, wherein the high level and low level of the first through fourth signals are positive voltages, respectively.

17. A semiconductor integrated circuit device according to claim 16, wherein the first potential represents the operating voltage for powering the circuit device.

18. A semiconductor integrated circuit device according to claim 17, wherein the first and third MOSFETs are applied with complementary voltages at gates thereof.

* * * * *